United States Patent
Syue et al.

(10) Patent No.: US 9,768,293 B1
(45) Date of Patent: Sep. 19, 2017

(54) LATERALLY DIFFUSED METAL-OXIDE-SEMICONDUCTOR (LDMOS) TRANSISTOR WITH A VERTICAL CHANNEL REGION

(71) Applicant: Taiwan Semiconductor Manufacturing Co., Ltd., Hsin-Chu (TW)

(72) Inventors: Wan-Jyun Syue, Hsinchu County (TW); Chin-Yi Huang, Hsinchu (TW); Kuo-Lung Tzeng, Yilan County (TW); Zhuo-Cang Yang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/162,781

(22) Filed: May 24, 2016

(51) Int. Cl.
| | |
|---|---|
| *H01L 29/66* | (2006.01) |
| *H01L 29/78* | (2006.01) |
| *H01L 29/10* | (2006.01) |
| *H01L 29/06* | (2006.01) |
| *H01L 21/265* | (2006.01) |

(52) U.S. Cl.
CPC .... *H01L 29/7825* (2013.01); *H01L 21/26513* (2013.01); *H01L 29/0653* (2013.01); *H01L 29/1083* (2013.01); *H01L 29/1095* (2013.01); *H01L 29/66704* (2013.01)

(58) Field of Classification Search
CPC .......... H01L 29/66681; H01L 29/7816; H01L 29/6659; H01L 29/7833; H01L 29/7836; H01L 29/66674; H01L 29/7801; H01L 21/0415; H01L 21/046; H01L 21/2253; H01L 21/31155; H01L 21/76859; H01L 27/10823; H01L 27/10876; H01L 29/4236; H01L 29/66704; H01L 29/66734; H01L 29/7397; H01L 29/7813; H01L 29/7825
USPC ........ 257/339, 342, 343, 344; 438/156, 163, 438/197, 206, 207, 259, 270, 212, 514, 438/589
See application file for complete search history.

(56) References Cited

U.S. PATENT DOCUMENTS

| | | | |
|---|---|---|---|
| 7,033,891 B2* | 4/2006 | Wilson | H01L 29/7835 257/329 |
| 7,871,882 B2* | 1/2011 | Parthasarathy | H01L 29/66333 438/235 |
| 9,006,063 B2* | 4/2015 | Yong | H01L 21/265 257/E21.551 |

(Continued)

*Primary Examiner* — Sonya D McCall Shepard
(74) *Attorney, Agent, or Firm* — Eschweiler & Potashnik, LLC

(57) ABSTRACT

A laterally diffused metal-oxide-semiconductor (LDMOS) transistor with a vertical channel region is provided. A first semiconductor region is formed over a second semiconductor region and with a first doping type. The second semiconductor region has a second doping type different than the first doping type. A gate electrode is formed laterally adjacent to the first semiconductor region and extending along a side boundary of the first semiconductor region. A first source/drain contact region and a second source/drain contact region are respectively formed on opposite sides of the gate electrode and with the second doping type. The first source/drain contact region is further formed over the first semiconductor region. A method for manufacturing the LDMOS transistor is also provided.

20 Claims, 20 Drawing Sheets

(56) References Cited

U.S. PATENT DOCUMENTS

2014/0070315 A1  3/2014  Levy et al.

* cited by examiner

LATERALLY DIFFUSED METAL-OXIDE-SEMICONDUCTOR (LDMOS) TRANSISTOR WITH A VERTICAL CHANNEL REGION

BACKGROUND

Power metal-oxide-semiconductor field-effect transistors (MOSFETs) are MOSFETs designed to handle significant power levels, such as high voltages and/or high currents. Power MOSFETs find application in display drivers, power converters, motor controllers, vehicle power devices, and so on. One type of power MOSFET is a laterally-diffused metal-oxide semiconductor (LDMOS) transistor. LDMOS transistors have high gain, high power output, and high efficiency at high frequencies, such that LDMOS transistors are commonly used with microwave and radio frequency (RF) power amplifiers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
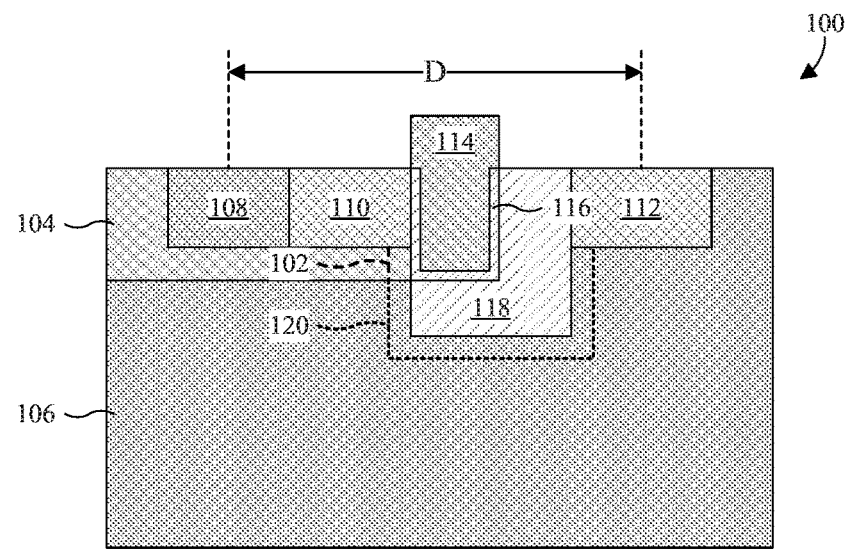
FIG. 1 illustrates a cross-sectional view of some embodiments of a laterally-diffused metal-oxide semiconductor (LDMOS) transistor with a vertical channel region.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some laterally diffused metal-oxide-semiconductor (LMOS) transistors comprise a channel region and a drift region arranged end to end, and extending laterally along an upper or top surface of a semiconductor substrate from a source contact region to a drain contact region. The channel region and the source contact region are arranged in a p-type semiconductor region, and the channel region extends laterally from the source contact region to the drift region. The drift region and the drain contact region are arranged in an n-type semiconductor region, and the drift region extends laterally from the channel region to the drain contact region. A gate electrode is arranged over the channel region and has a lower or bottom surface spaced above the upper or top surface of the semiconductor substrate.

A shortcoming with the LDMOS transistors is that a distance laterally from the source contact region to the drain contact region is large, such that a pitch of the LDMOS transistors during bulk manufacture is large. The large pitch, in turn, increases costs since few LDMOS transistors may be concurrently manufactured. Additionally, an ON resistance of the LDMOS transistors (i.e., a resistance in saturation) is large, since the ON resistance is proportional to the distance from the source contact region to the drain contact region. This, in turn, may lead to low gain, low power output, and low efficiency.

The present application is directed towards an LDMOS transistor with a vertical channel region for small pitch and small ON resistance. In some embodiments, a first semiconductor region is arranged over a second semiconductor region. Further, the first and second semiconductor regions respectively have a first doping type and a second doping type different than the first doping type. A first source/drain contact region and a second source/drain contact region have the second doping type and are laterally spaced. Further, the first source/drain contact region is arranged over the first semiconductor region. A gate electrode is arranged laterally adjacent to the first semiconductor region and laterally between the first and second source/drain contact regions. Further, the gate electrode extends along a side boundary of the first semiconductor region and, in some embodiments, is arranged in a trench isolation region, such as a shallow trench isolation (STI) region or a deep trench isolation (DTI) region.

The gate electrode advantageously defines the vertical channel region extending from the first source/drain contact region to a drift region in the second semiconductor region. The vertical channel region allows the LDMOS transistor to have a small distance laterally from the first source/drain contact region to the second source/drain contact region, which allows a small pitch during bulk manufacture. Further, the vertical channel region allows the LDMOS transistor to have a small ON resistance, which allows the LDMOS transistor to have high gain, high power output, high efficiency, or a combination of the foregoing. The trench isolation region advantageously provides a high degree of isolation to the gate electrode, which allows the LDMOS transistor to have a large breakdown voltage.

With reference to FIG. 1, a cross-sectional view 100 of some embodiments of a LDMOS transistor with a vertical channel region 102 is provided. As illustrated, a first semiconductor region 104 with a first doping type is arranged over a second semiconductor region 106 with a second doping type opposite the first doping type. The first and second doping types may respectively be, for example, p-type and n-type. The first semiconductor region 104 has a lower or bottom boundary that is vertically spaced above a lower or bottom boundary of the second semiconductor region 106 and, in some embodiments, has an upper or top boundary that is about even with an upper or top boundary of the second semiconductor region 106.

A body contact region 108 and a first source/drain contact region 110 are arranged over the first semiconductor region 104, and respectively have the first and second doping types. In some embodiments, the body contact region 108 and the first source/drain contact region 110 are arranged directly over the first semiconductor region 104. The body contact region 108 and the first source/drain contact region 110 have lower or bottom boundaries that are vertically spaced above the lower or bottom boundary of the first semiconductor region 104 and, in some embodiments, have upper or top boundaries that are about even with the upper or top boundary of the first semiconductor region 104. Further, the body contact region 108 and the first source/drain contact region 110 have elevated doping concentrations relative to the first semiconductor region 104.

A second source/drain contact region 112 is arranged over the second semiconductor region 106, and has the second doping type with a doping concentration elevated relative to the second semiconductor region 106. The second source/drain contact region 112 is laterally spaced from the body contact region 108 with the first source/drain contact region 110 arranged laterally between the body contact region 108 and the second source/drain contact region 112. Further, the second source/drain contact region 112 has a lower or bottom boundary that is vertically spaced above the lower or bottom boundary of the first semiconductor region 104 and, in some embodiments, has an upper or top boundary that is about even with the upper or top boundary of the first semiconductor region 104.

A gate electrode 114 is arranged adjacent to the first semiconductor region 104, laterally between the first and second source/drain contact regions 110, 112. The gate electrode 114 extends vertically along a side boundary of the first semiconductor region 104 to below the first source/drain contact region 110, thereby defining the vertical channel region 102 in the first semiconductor region 104. The gate electrode 114 is insulated from the first and second source/drain contact regions 110, 112 and/or the first and second semiconductor regions 104, 106 by a gate dielectric layer 116 lining a lower surface of the gate electrode 114 and/or an isolation region 118 into which the gate electrode 114 extends.

The vertical channel region 102 extends along the side boundary of the first semiconductor region 104, from the lower or bottom boundary of the first source/drain contact region 110 to the lower or bottom boundary of the first semiconductor region 104. The vertical channel region 102 is configured to selectively conduct depending upon a bias applied to the gate electrode 114, thereby selectively electrically coupling the first source/drain contact region 110 to a drift region 120 in the second semiconductor region 106. The drift region 120 electrically couples the vertical channel region 102 to the second source/drain contact region 112, and has a high resistance compared to the vertical channel region 102 in saturation to facilitate a high breakdown voltage.

Advantageously, the vertical channel region 102 allows a lateral distance D from the body contact region 108 to the second source/drain contact region 112 to be small, which allows a low pitch during bulk manufacture. Further, the vertical channel region 102 allows the LDMOS transistor to have a low ON resistance, since the ON resistance is proportional to the lateral distance D. The low ON resistance, in turn, allows the LDMOS transistor to have high gain, high power output, high efficiency, or a combination of the foregoing. Even more, the isolation region 118 advantageously provides a high degree of isolation for the gate electrode 114, which allows the LDMOS transistor to have a high breakdown voltage.

With reference to FIGS. 2A-2H, cross-sectional views 200A-200H of some planar embodiments of the LDMOS transistor of FIG. 1 are provided.

Figure 2A:
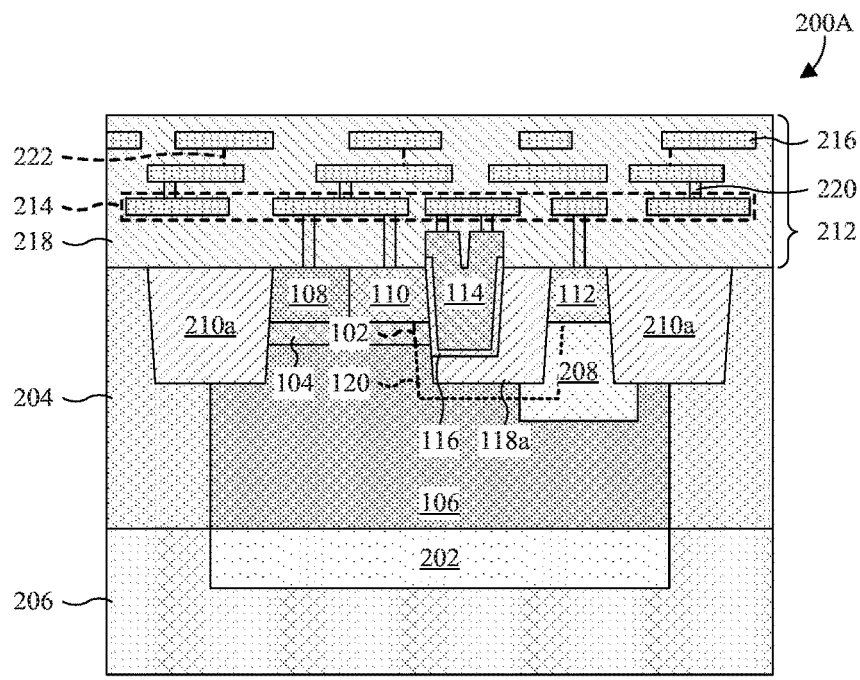
FIGS. 2A-2H illustrate cross-sectional views of some planar embodiments of the LDMOS transistor of FIG. 1.

As illustrated by the cross-sectional view 200A of FIG. 2A, the second semiconductor region 106 is arranged over a third semiconductor region 202 with the second doping type and a higher doping concentration. Further, in some embodiments, an upper or top boundary of the third semiconductor region 202 contacts a lower or bottom boundary of the second semiconductor region 106. The second semiconductor region 106 is arranged within an epitaxial layer 204 covering a semiconductor substrate 206, and the third semiconductor region 202 is arranged within the semiconductor substrate 206. The semiconductor substrate 206 may be, for example, a monocrystalline silicon substrate, and/or the epitaxial layer 204 may be, for example, a monocrystalline silicon layer. Further, bulks of the semiconductor substrate 206 and the epitaxial layer 204 may be, for example, undoped or may have the first doping type.

A fourth semiconductor region 208 with the second doping type is arranged over the second semiconductor region 106, laterally spaced from the first semiconductor region 104. The fourth semiconductor region 208 has a lower or bottom boundary that is vertically spaced above the lower or bottom boundary of the second semiconductor region 106 and, in some embodiments, has an upper or top boundary that is about even with the upper or top boundary of the second semiconductor region 106. Further, the fourth semiconductor region 208 underlies the second source/drain contact region 112 and, in some embodiments, has a doping concentration that is respectively high and low compared to the second semiconductor region 106 and the second source/drain contact region 112.

A first STI region 118a and a second STI region 210a are arranged over and extend into the epitaxial layer 204. The first STI region 118a laterally spaces the first and second source/drain contact regions 110, 112 and, in some embodiments, the first and fourth semiconductor regions 104, 208. The second STI region 210a laterally surrounds the first STI region 118a along a periphery of the second semiconductor region 106 and, in some embodiments, contacts the first semiconductor region 104 and/or the fourth semiconductor region 208. The first and second STI regions 118a, 210a have lower or bottom boundaries that are vertically spaced over the lower or bottom boundary of the second semiconductor region 106 and that are arranged below the lower or bottom boundary of the first semiconductor region 104. Further, the first and second STI regions 118a, 210a have upper or top boundaries that are elevated above or about even with the upper or top boundaries of the first and second source/drain contact regions 110, 112.

The gate electrode 114 extends into the first STI region 118a, laterally between the first semiconductor region 104 and the first STI region 118a, to below the lower or bottom boundary of the first semiconductor region 104. The gate electrode 114 is insulated from the first and second semiconductor regions 104, 106 by the gate dielectric layer 116 and defines the vertical channel region 102 in the first semiconductor region 104. The gate electrode 114 may be, for example, doped polysilicon, metal, or some other conductive material, and the gate dielectric layer 116 may be, for example, silicon dioxide or some other dielectric.

An interconnect structure 212 is arranged over the epitaxial layer 204, and comprises multiple layers 214 of conductive features 216, such as lines or pads, stacked within an interlayer dielectric (ILD) region 218. The ILD region 218 may be, for example, silicon dioxide or a low κ dielectric (i.e., a dielectric with a dielectric constant less than about 3.9). The layers 214 of conductive features 216 are electrically coupled to one another, as well as to the first and second source/drain contact regions 110, 112 and the body contact region 108, by vias 220. For ease of illustration, dashed lines 222 are employed to represent one or more additional layers of vias and/or conductive features. The vias 220 and the conductive features 216 may be, for example, aluminum copper, copper, gold, aluminum, tungsten, or a combination of the foregoing.

Figure 2B:
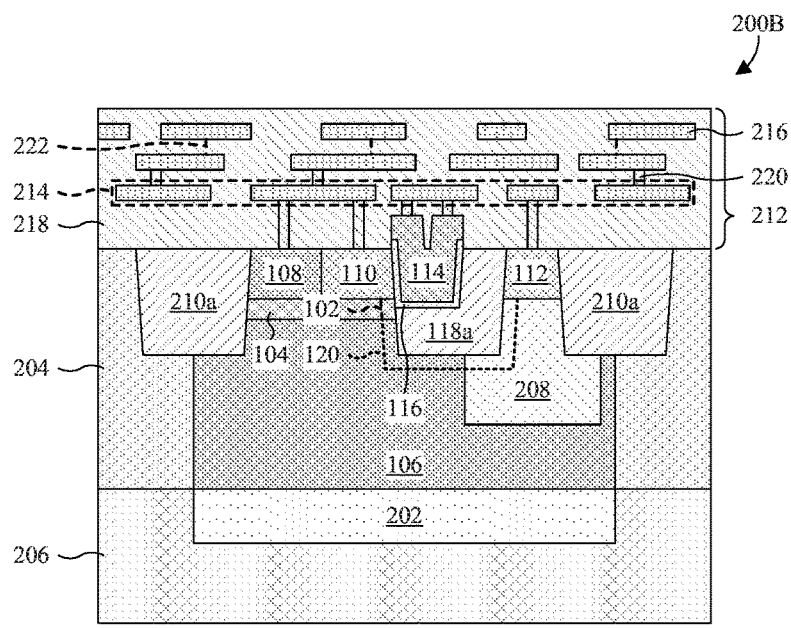

As illustrated by the cross-sectional view 200B of FIG. 2B, the gate electrode 114 extends into the first STI region 118a to a location below the lower or bottom boundary of the first source/drain contact region 110 and above the lower or bottom boundary of the first semiconductor region 104.

Figure 2C:
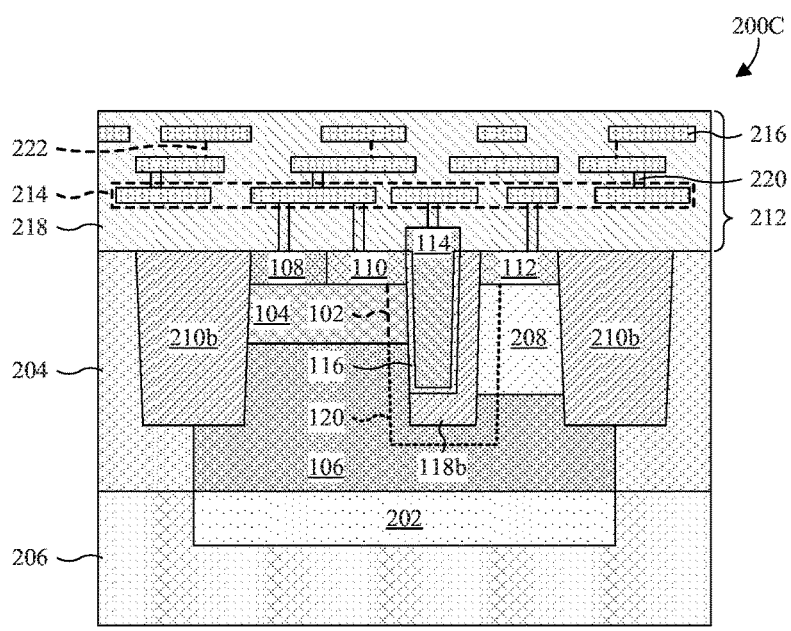

As illustrated by the cross-sectional view 200C of FIG. 2C, a first DTI region 118b and a second DTI region 210b extend into the epitaxial layer 204. The first DTI region 118b laterally spaces the first and second source/drain contact regions 110, 112 and, in some embodiments, the first and fourth semiconductor regions 104, 208. The second DTI region 210b laterally surrounds the first DTI region 118b along a periphery of the second semiconductor region 106 and, in some embodiments, contacts the first semiconductor region 104 and/or the fourth semiconductor region 208. The first and second DTI regions 118b, 210b have lower or bottom boundaries that are vertically spaced over the lower or bottom boundary of the second semiconductor region 106 and that are arranged below the lower or bottom boundary of the first semiconductor region 104. Further, in some embodiments, the first and second DTI regions 118b, 210b have upper or top boundaries that are elevated above or about even with the upper or top boundaries of the first and second source/drain contact regions 110, 112.

Figure 2D:
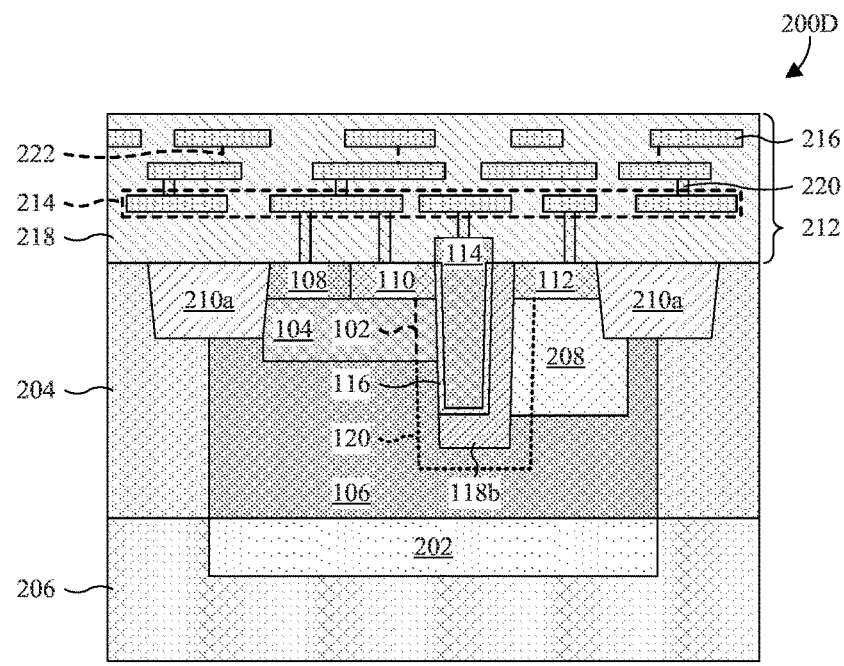

As illustrated by the cross-sectional view 200D of FIG. 2D, the first DTI region 118b laterally spaces the first and second source/drain contact regions 110, 112, and the second STI region 210a laterally surrounds the first DTI region 118b along a periphery of the second semiconductor region 106. In other embodiments, the first STI region 118a (see, e.g., FIGS. 2A and 2B) laterally spaces the first and second source/drain contact regions 110, 112, and the second DTI region 210b (see, e.g., FIG. 2C) laterally surrounds the first STI region 118a along a periphery of the second semiconductor region 106.

Figure 2E:
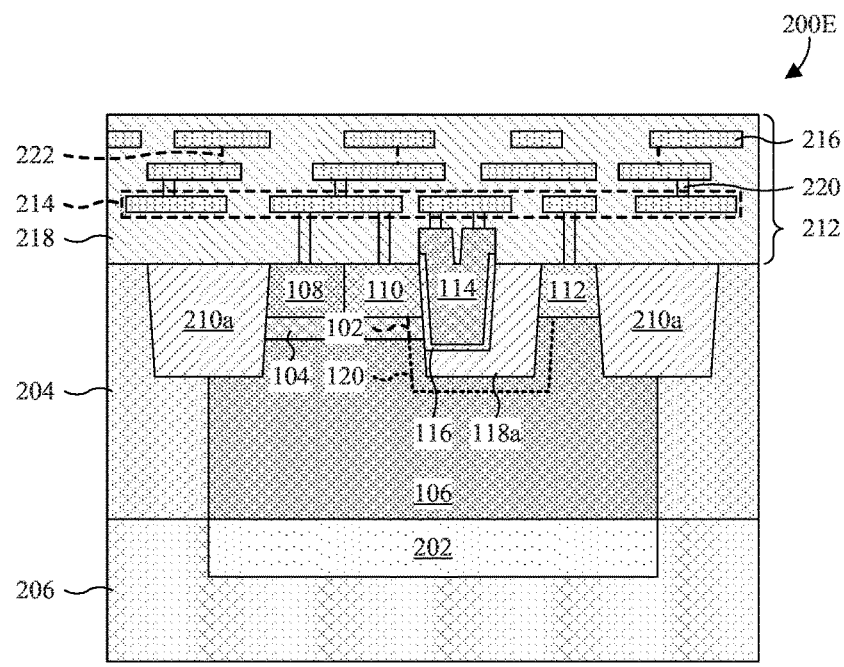

As illustrated by the cross-sectional view 200E of FIG. 2E, the fourth semiconductor region 208 of FIGS. 2A-2D may be omitted. While illustrated as being omitted from FIG. 2A, it is to be appreciated that it may also be omitted from FIGS. 2B-2D or other embodiments of the LDMOS transistor described herein.

Figure 2F:
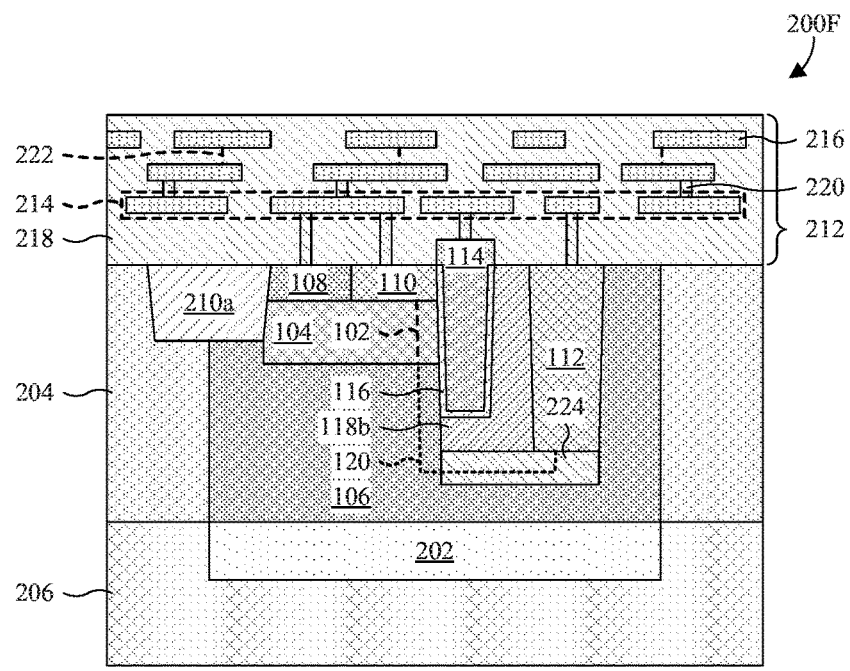

As illustrated by the cross-sectional view 200F of FIG. 2F, the lower or bottom boundary of the second source/drain contact region 112 is about even with the lower or bottom boundary of the first DTI region 118b. Further, a fifth semiconductor region 224 with the second doping type is arranged over the second semiconductor region 106, and under the second source/drain contact region 112 and the first DTI region 118b. In some embodiments, the fifth semiconductor region 224 has a different doping concentration than the second source/drain contact region 112 and/or the second semiconductor region 106. Further, in some embodiments, an upper or top boundary of the fifth semiconductor region 224 contacts the first DTI region 118b and the second source/drain contact region 112, and/or is confined to directly under the first DTI region 118b and the second source/drain contact region 112.

Also illustrated by the cross-sectional view 200F of FIG. 2F, in some embodiments, the second STI region 210a is confined to a side of the LDMOS transistor that accommodates the first semiconductor region 104. For example, the second STI region 210a may have a U-shape extending laterally from the first DTI region 118b, around the side of the LDMOS transistor accommodating the first semiconductor region 104, and back to the first DTI region 118b.

Figure 2G:
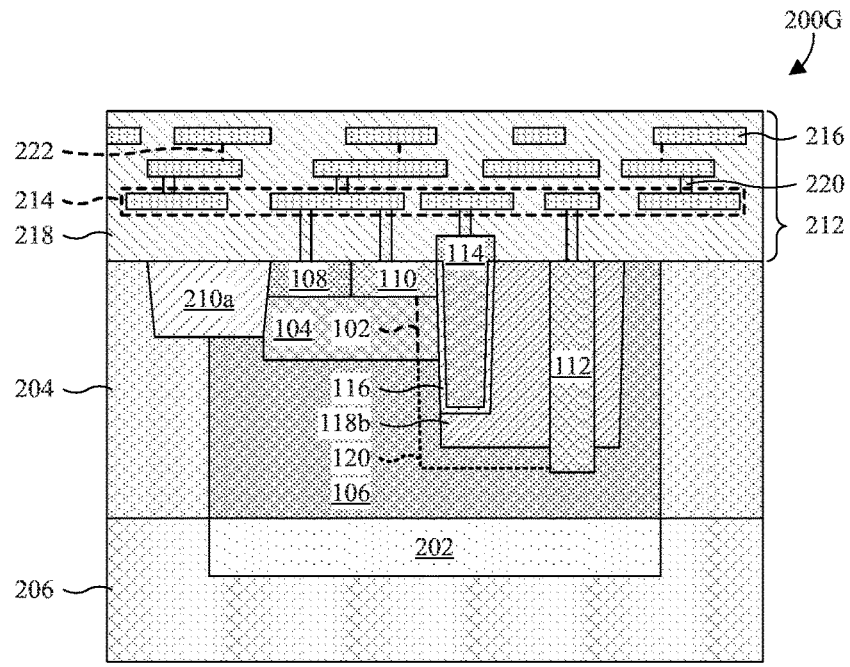

As illustrated by the cross-sectional view 200G of FIG. 2G, the second source/drain contact region 112 extends through the first DTI region 118b, to below the lower or bottom boundary of the first DTI region 118b. Further, in some embodiments, the second STI region 210a is confined to a side of the LDMOS transistor that accommodates the first semiconductor region 104, as described in FIG. 2F.

Figure 2H:
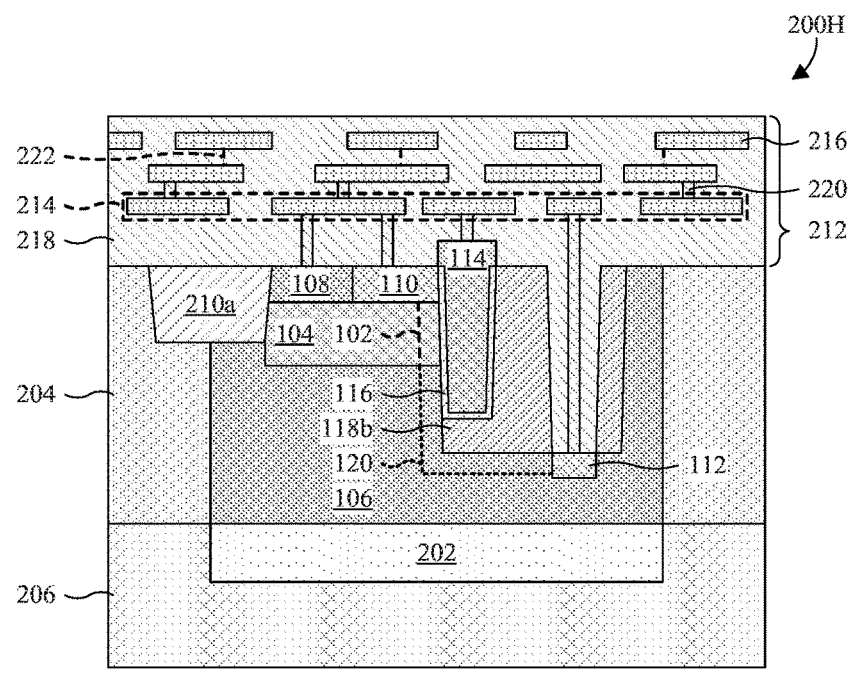

As illustrated by the cross-sectional view 200H of FIG. 2H, the second source/drain contact region 112 is arranged under the first DTI region 118b and the ILD region 218 extends vertically through the first DTI region 118b to the second source/drain contact region 112. Further, in some embodiments, the second STI region 210a is confined to a side of the LDMOS transistor that accommodates the first semiconductor region 104, as described in FIG. 2F.

With reference to FIGS. 3A-3D, cross-sectional and perspective views 300A-300D of some first fin field-effect transistor (finFET) embodiments of the LDMOS transistor of FIG. 1 are provided.

Figure 3A:
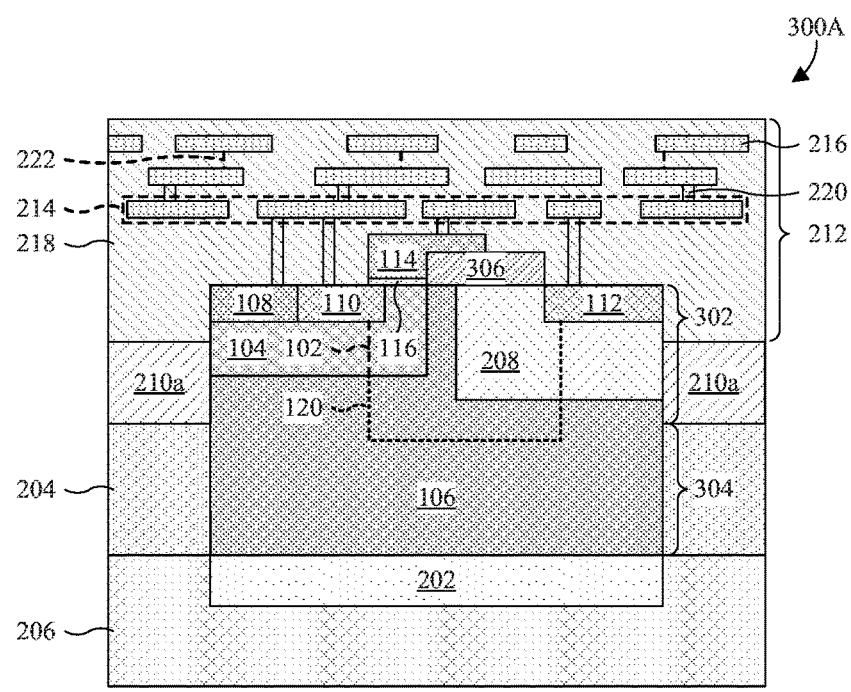
FIGS. 3A-3D illustrate cross-sectional and perspective views of some first fin field-effect transistor (finFET) embodiments of the LDMOS transistor of FIG. 1.

As illustrated by the cross-sectional view 300A of FIG. 3A, the second semiconductor region 106 is arranged in a fin region 302 of the epitaxial layer 204 that is laterally surrounded by the second STI region 210a. The fin region 302 protrudes vertically up from a base region 304 of the epitaxial layer 204 to above the second STI region 210a, and further accommodates the first and fourth semiconductor regions 104, 208, the first and second source/drain contact regions 110, 112, and the body contact region 108. In alternative embodiments, the fourth semiconductor region 208 is omitted.

A recessed dielectric layer 306 is arranged over the fin region 302 and, in some embodiments, the fourth semiconductor region 208. The recessed dielectric layer 306 extends laterally towards the first source/drain contact region 110 from the second source/drain contact region 112 and, in some embodiments, extends to about even with a side boundary of the first semiconductor region 104. Further, as will be seen hereafter, the recessed dielectric layer 306 straddles the fin region 302. The recessed dielectric layer 306 may be, for example, an oxide, such as silicon dioxide, or some other dielectric.

The gate electrode 114 is arranged over the first semiconductor region 104, electrically insulated therefrom by the gate dielectric layer 116. The gate electrode 114 extends laterally from the first source/drain contact region 110 towards to the recessed dielectric layer 306, and overhangs part of the recessed dielectric layer 306. Further, as will be seen hereafter, the gate electrode 114 and the gate dielectric layer 116 straddle the fin region 302 to define the vertical channel region 102 in the first semiconductor region 104.

Figure 3B:
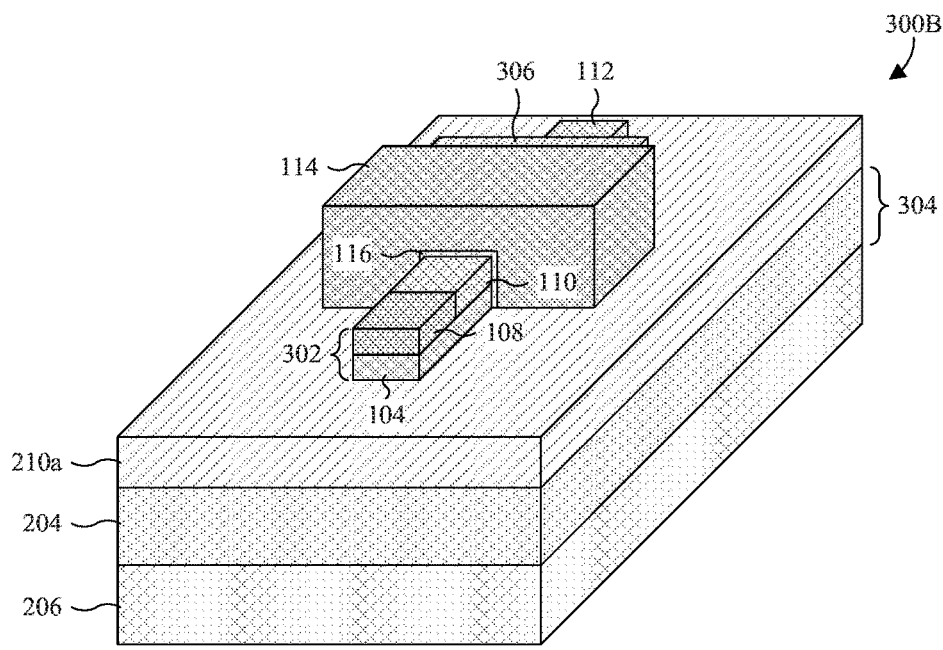

As illustrated by the perspective view 300B of FIG. 3B, the fin region 302 extends vertically above the second STI region 210a and accommodates the first semiconductor region 104, the body contact region 108, and the first and second source/drain contact regions 110, 112. Further, the first and second source/drain contact regions 110, 112 are laterally spaced along an upper or top boundary of the fin region 302, and the gate electrode 114, the gate dielectric layer 116, and the recessed dielectric layer 306 straddle the fin region 302 laterally between the first and second source/drain contact regions 110, 112. As should be appreciated, the interconnect structure 212 of FIG. 3A has been omitted to allow the underlying structure to be better seen.

Figure 3C:
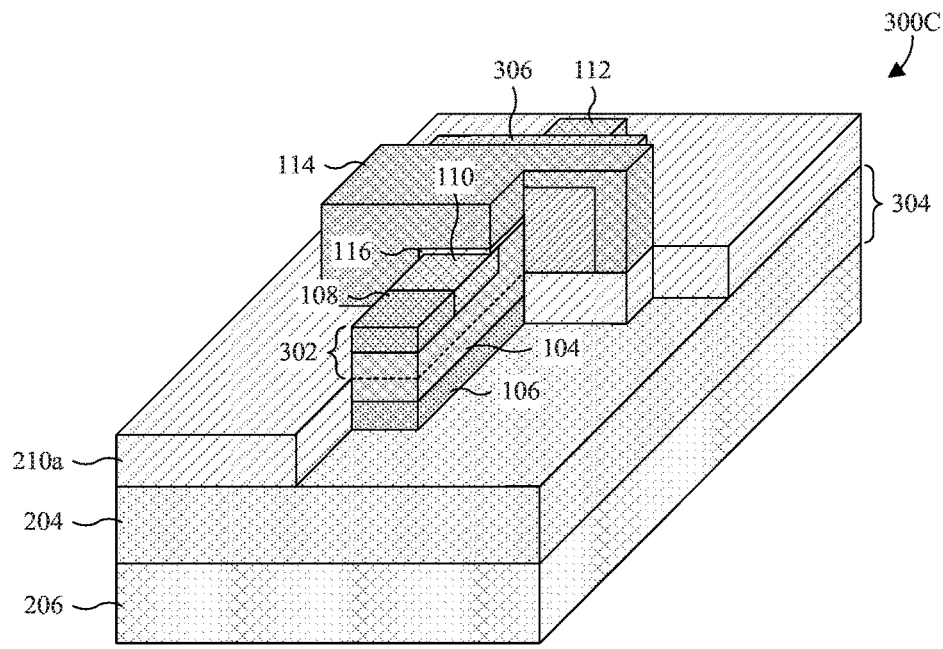

As illustrated by the perspective views 300C of FIG. 3C, the second STI region 210a, the gate electrode 114, and the gate dielectric layer 116 have been partially cut away to allow the underlying structure to be better seen.

Figure 3D:
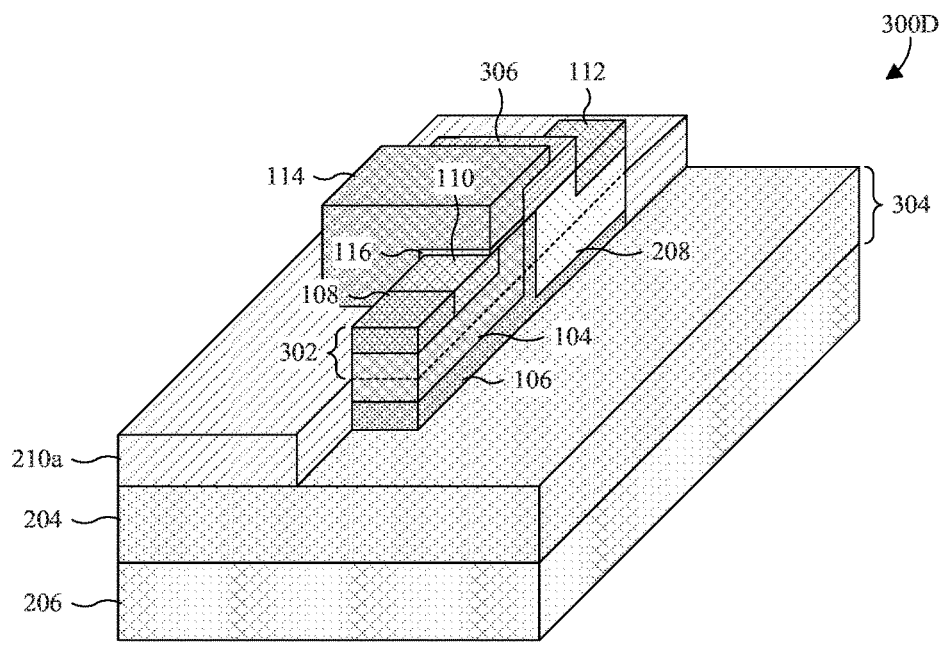

As illustrated by the perspective view 300D of FIG. 3D, the second STI region 210a, the gate electrode 114, and the gate dielectric layer 116 have been further cut away compared to FIG. 3C to allow the underlying structure to be better seen. Further, the recessed dielectric layer 306 has been partially cut away to allow the underlying structure to be better seen.

With reference to FIGS. 4A-4D, cross-sectional and perspective views 400A-400D of some second finFET embodiments of the LDMOS transistor of FIG. 1 are provided.

Figure 4A:
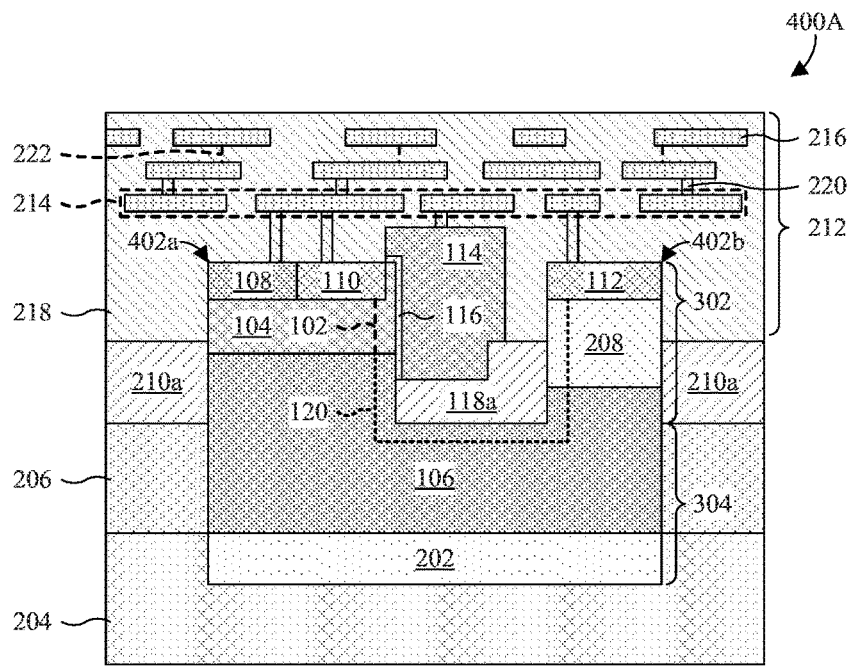
FIGS. 4A-4D illustrate cross-sectional and perspective views of some second finFET embodiments of the LDMOS transistor of FIG. 1.

As illustrated by the cross-sectional view 400A of FIG. 4A, the fin region 302 of the epitaxial layer 204 is split along its length to define a first fin section 402a and a second fin section 402b. The first and second fin sections 402a, 402b are laterally spaced with the gate electrode 114 and the first STI region 118a arranged laterally therebetween. Further, the first fin section 402a accommodates the first semiconductor region 104, the body contact region 108, and the first source/drain contact region 110, and the second fin section 402b accommodates the second source/drain contact region 112 and the fourth semiconductor region 208. In alternative embodiments, the fourth semiconductor region 208 is omitted.

The gate electrode 114 extends into the first STI region 118a, laterally between the first and second fin sections 402a, 402b, from over the first and second fin sections 402a, 402b and is laterally spaced from the second fin section 402b. Further, in some embodiments, the gate electrode 114 comprises a lower surface overhanging the first STI region 118a proximate the second fin section 402b to advantageously facilitate a high breakdown voltage. The first STI region 118a and the gate dielectric layer 116 electrically insulate the gate electrode 114 from the first and second semiconductor regions 104, 106, and the insulation provided by the first STI region 118a advantageously allows the LDMOS transistor to achieve a high breakdown voltage.

Further, in some embodiments, the first STI region 118a contacts or is otherwise part of a same layer as the second STI region 210a.

Figure 4B:
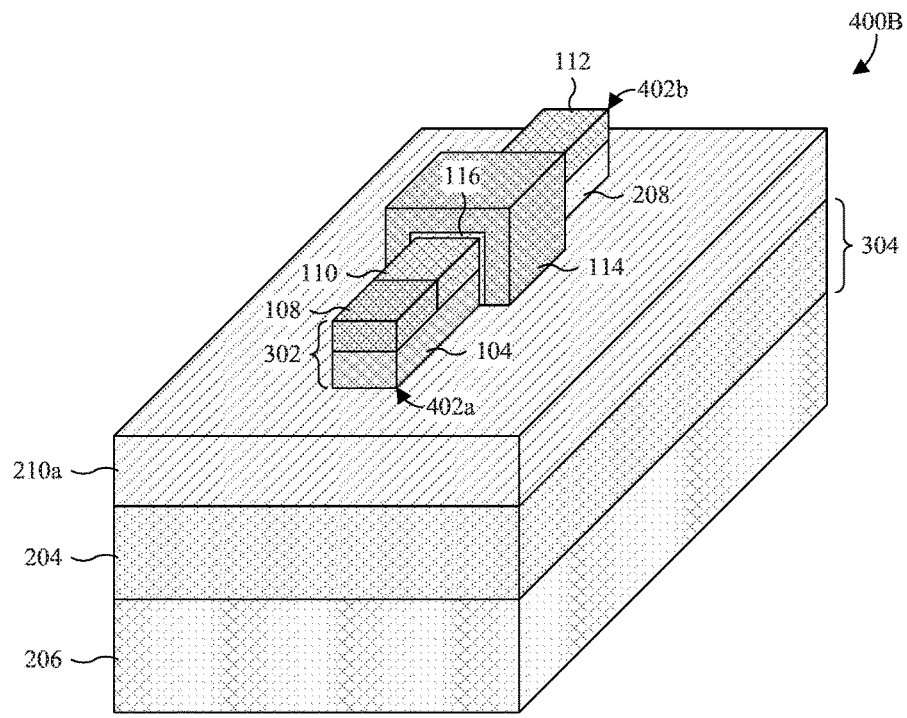

As illustrated by the perspective view 400B of FIG. 4B, the gate electrode 114 and the gate dielectric layer 116 cover an end of the first fin section 402a, while straddling the first fin section 402a, and are arranged laterally between the first and second fin sections 402a, 402b. As should be appreciated, the interconnect structure 212 of FIG. 4A has been omitted to allow the underlying structure to be better seen.

Figure 4C:
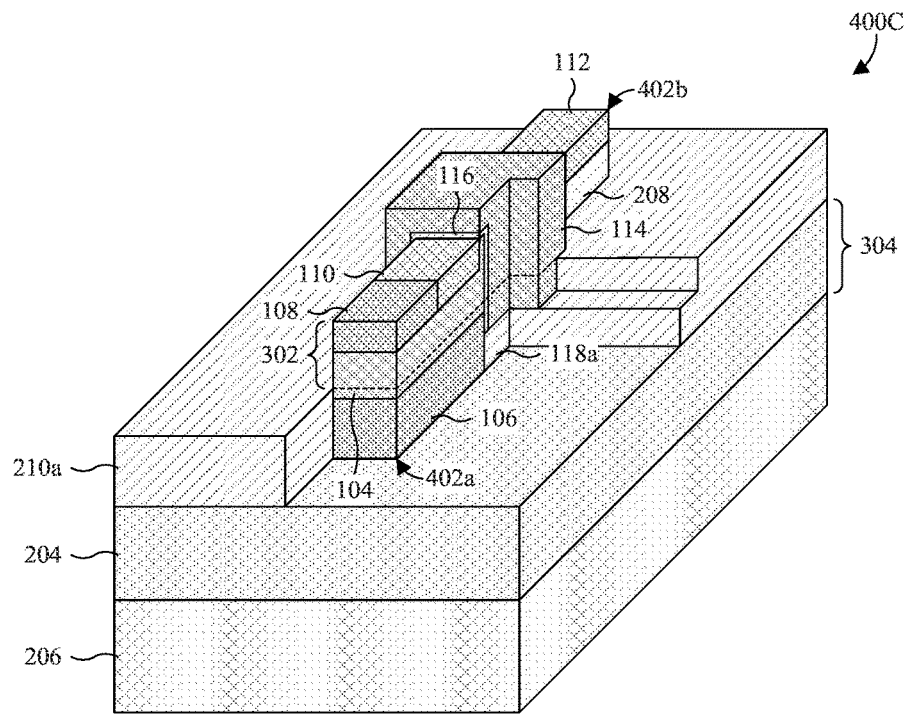

As illustrated by the perspective views 400C of FIG. 4C, the second STI region 210a, the gate electrode 114, and the gate dielectric layer 116 have been partially cut away to allow the underlying structure to be better seen, such as the first STI region 118a.

Figure 4D:
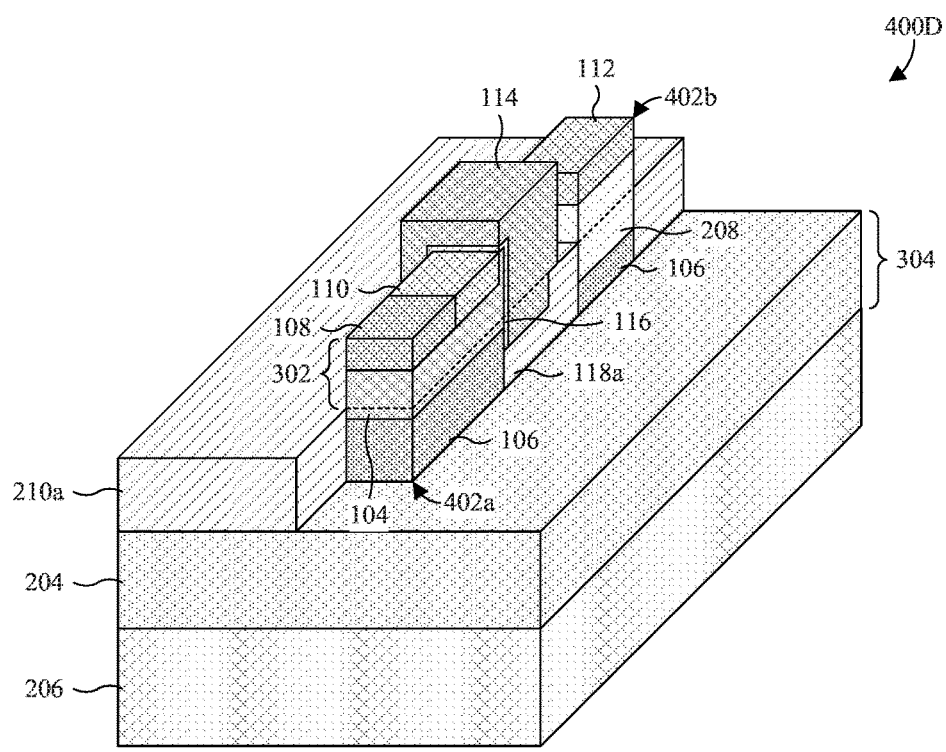

As illustrated by the perspective view 400D of FIG. 4D, the second STI region 210a, the gate electrode 114, and the gate dielectric layer 116 have been further cut away compared to FIG. 4C to allow the underlying structure to be better seen.

While the second and third semiconductor regions 106, 202 were respectively illustrated within the epitaxial layer 204 and the semiconductor substrate 206 within FIGS. 2A-2H, 3A-3D, and 4A-4D, the third semiconductor region 202 may be arranged in the epitaxial layer 204 in other embodiments of the LDMOS transistor. Further, in yet other embodiments of the LDMOS transistor, the epitaxial layer 204 may be omitted, such that the second and third semiconductor regions 106, 202 are both arranged within the semiconductor substrate 206.

With reference to FIGS. 5-17, a series of cross-sectional views 500-1700 of some planar embodiments of a method for manufacturing an LDMOS transistor with a vertical channel region is provided. As will be seen, the cross-sectional views 500-1700 are directed towards the LDMOS transistor of FIG. 2A. However, it is to be appreciated that the actions illustrated by the cross-sectional views 500-1700 may be extended to cover other embodiments of the LDMOS transistor, such as the embodiments of FIGS. 2B-2H.

Figure 5:
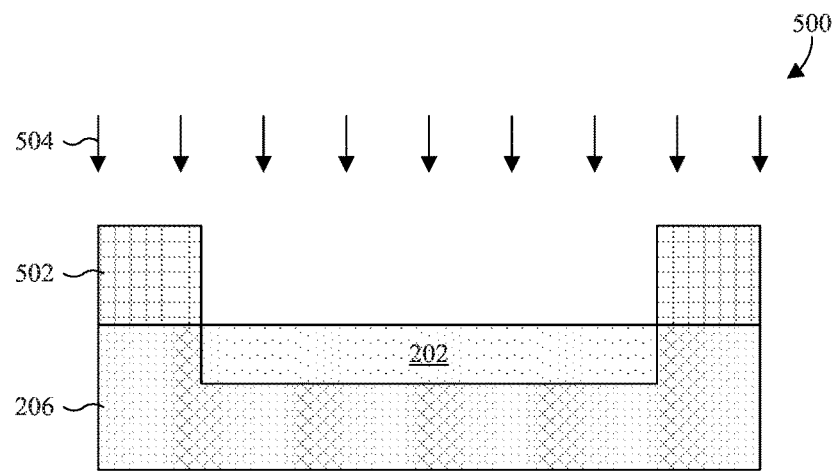
FIGS. 5-17 illustrate a series of cross-sectional views of some planar embodiments of a method for manufacturing an LDMOS transistor with a vertical channel region.

As illustrated by the cross-sectional view 500 of FIG. 5, a third semiconductor region 202 is formed in a semiconductor substrate 206 and with a second doping type. Further, in some embodiments, the third semiconductor region 202 is formed along an upper or top surface of the semiconductor substrate 206. The semiconductor substrate 206 may be, for example, monocrystalline silicon, and/or may be, for example, undoped or doped with a first doping type, such as p-type, that is opposite the second doping type. The first and second doping types may respectively be, for example, p-type and n-type. In some embodiments, the process for forming the third semiconductor region 202 comprises forming a first photoresist layer 502 over the semiconductor substrate 206, laterally surrounding a region of the semiconductor substrate 206 to be the third semiconductor region 202. Thereafter, in some embodiments, the process comprises performing ion implantation of dopants 504 into the region and subsequently removing the first photoresist layer 502.

Figure 6:
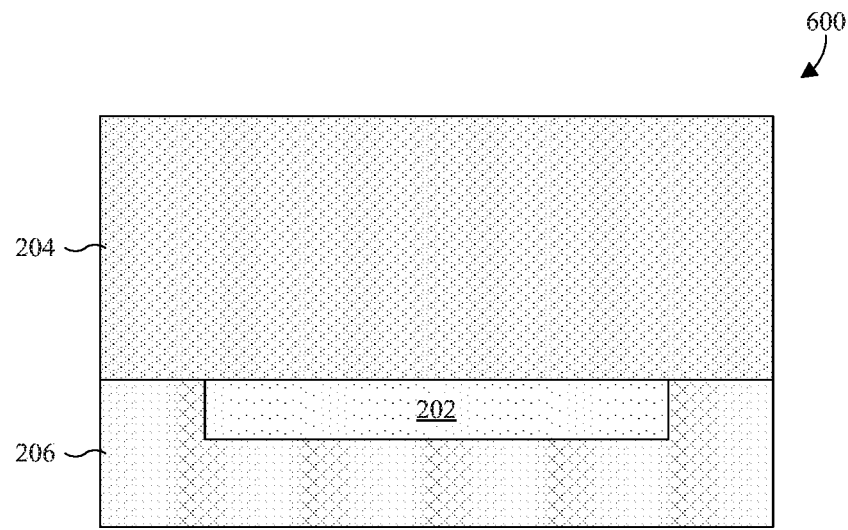

As illustrated by the cross-sectional view 600 of FIG. 6, an epitaxial layer 204 is formed over the semiconductor substrate 206 and the third semiconductor region 202. In some embodiments, the epitaxial layer 204 is formed by an epitaxial deposition or growth process, and/or is formed undoped or doped with the first doping type. For example, the epitaxial layer 204 may be formed with a p-type doping. Further, in some embodiments, the epitaxial layer 204 is formed of monocrystalline silicon.

While not illustrated, in alternative embodiments of the method, the epitaxial layer 204 is omitted. In such embodiments, the third semiconductor region 202 is implanted deep within the semiconductor substrate 206. The method may then proceed as described hereafter using the semiconductor substrate 206 in place of the epitaxial layer 204.

Figure 7:
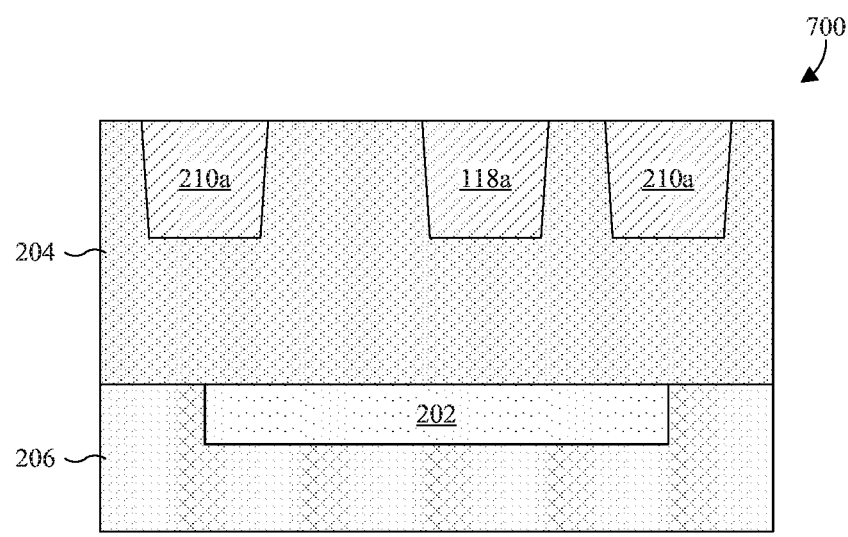

As illustrated by the cross-sectional view 700 of FIG. 7, a first STI region 118a and a second STI region 210a are formed over the epitaxial layer 204. Further, the first and second STI regions 118a, 210a are formed extending into the epitaxial layer 204 with the second STI region 210a laterally surrounding the first STI region 118a. In some embodiments, the process for forming the first and second STI regions 118a, 210a comprises performing an etch into the epitaxial layer 204 to form respective trenches of the first and second STI regions 118a, 210a, and subsequently filling the trenches with a dielectric, such as silicon dioxide.

Figure 8:
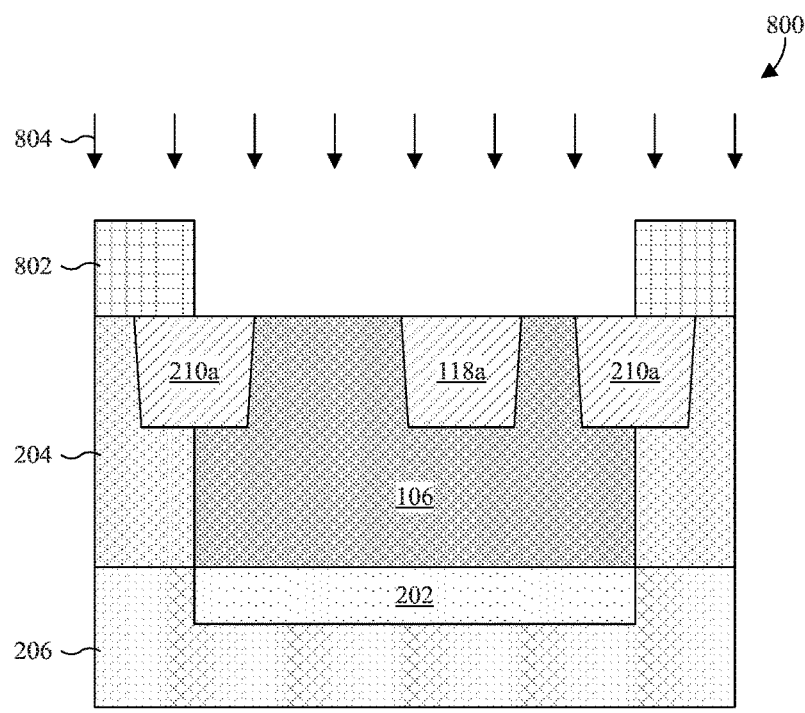

As illustrated by the cross-sectional view 800 of FIG. 8, a second semiconductor region 106 is formed in the epitaxial layer 204 and with the second doping type. Further, the second semiconductor region 106 is formed over the third semiconductor region 202 and may, for example, be formed with a doping concentration less than that of the third semiconductor region 202. In some embodiments, the process for forming the second semiconductor region 106 comprises forming a second photoresist layer 802 over the epitaxial layer 204, laterally surrounding a region of the epitaxial layer 204 to be the second semiconductor region 106. The second photoresist layer 802 may, for example, be lithographically formed with the same photomask used to form the first photoresist layer 502 of FIG. 5. Thereafter, in some embodiments, the process comprises performing ion implantation of dopants 804 into the region and subsequently removing the second photoresist layer 802.

Figure 9:
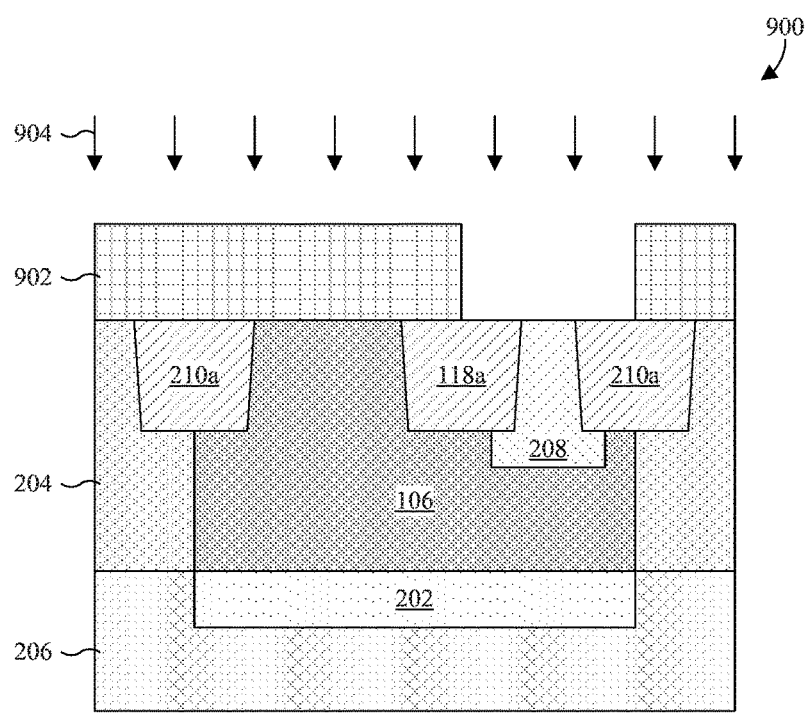

As illustrated by the cross-sectional view 900 of FIG. 9, in some embodiments, a fourth semiconductor region 208 is formed in the epitaxial layer 204, over the second semiconductor region 106, and with the second doping type. Further, in some embodiments, the fourth semiconductor region 208 is formed localized to a first side of the second semiconductor region 106, laterally between the first and second STI regions 118a, 210a, and/or with a doping concentration greater than that of the second semiconductor region 106. In some embodiments, the process for forming the fourth semiconductor region 208 comprises forming a third photoresist layer 902 over the epitaxial layer 204, laterally surrounding a region of the epitaxial layer 204 to be the fourth semiconductor region 208. Thereafter, in some embodiments, the process comprises performing ion implantation of dopants 904 into the region and subsequently removing the third photoresist layer 902.

Figure 10:
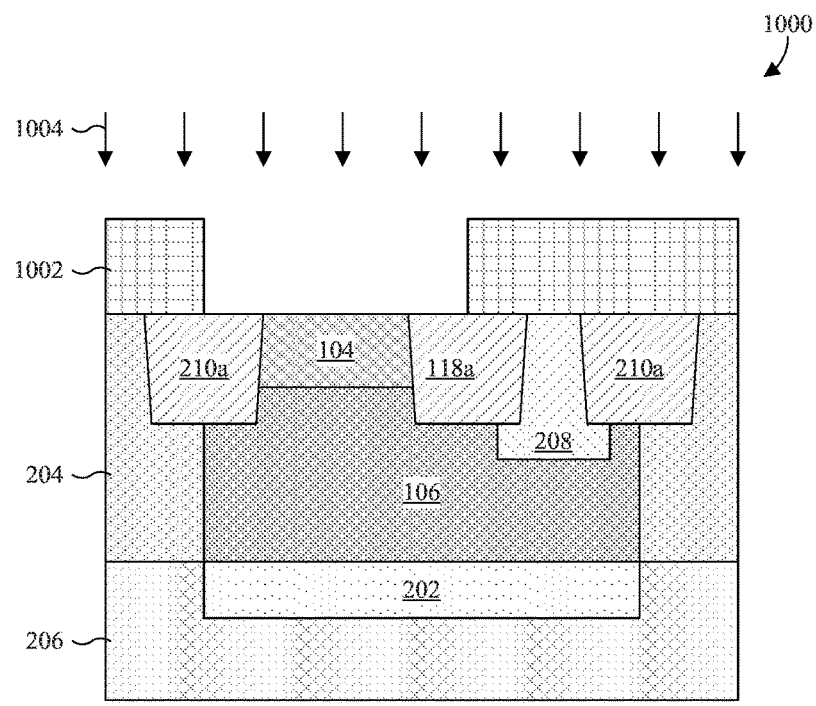

As illustrated by the cross-sectional view 1000 of FIG. 10, a first semiconductor region 104 is formed in the epitaxial layer 204, over the second semiconductor region 106, and with the first doping type. Further, the first semiconductor region 104 is formed localized to a second side of the second semiconductor region 106, opposite the first side, and laterally between the first and second STI regions 118a, 210a. In some embodiments, the process for forming the first semiconductor region 104 comprises forming a fourth photoresist layer 1002 over the epitaxial layer 204, laterally surrounding a region of the epitaxial layer 204 to be the first semiconductor region 104. Thereafter, in some embodiments, the process comprises performing ion implantation of dopants 1004 into the region and subsequently removing the fourth photoresist layer 1002.

Figure 11:
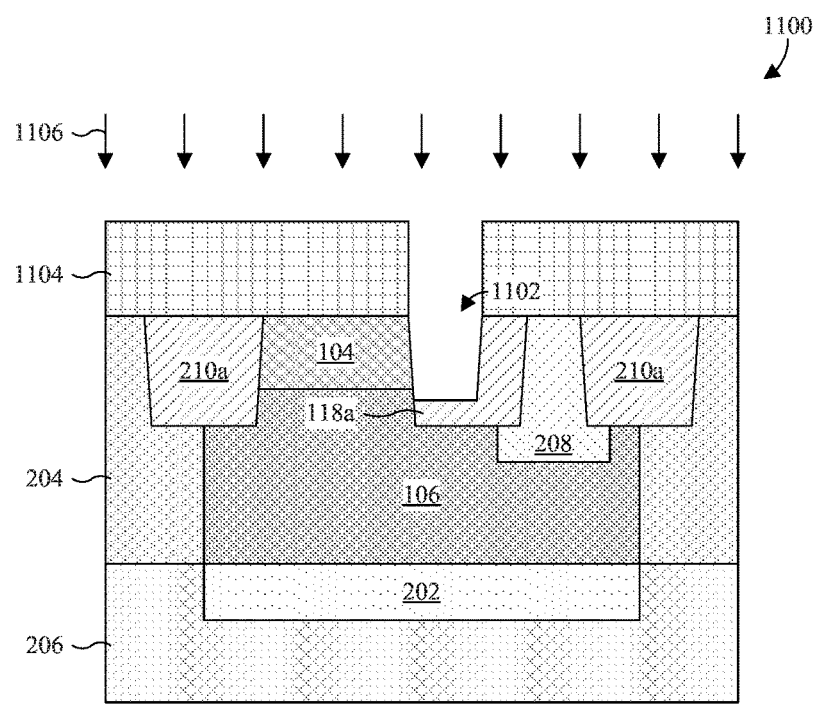

As illustrated by the cross-sectional view 1100 of FIG. 11, a first etch is performed into the first STI region 118a to form a gate opening 1102 arranged laterally between the first semiconductor region 104 and the first STI region 118a. In some embodiments, the first etch is performed to a location below a lower or bottom boundary of the first semiconductor region 104. Further, in some embodiments, the process for performing the first etch comprises forming a fifth photoresist layer 1104 over the epitaxial layer 204, laterally surrounding a region of the first STI region 118a corresponding to the gate opening 1102. Thereafter, in some embodiments, the process comprises applying etchants 1106 to the first STI region 118a and subsequently removing the fifth photoresist layer 1104.

Figure 12:
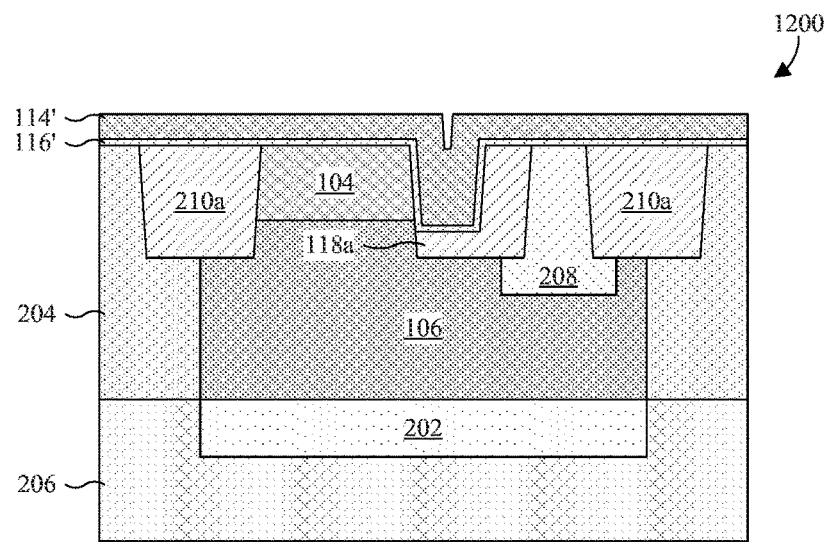

As illustrated by the cross-sectional view 1200 of FIG. 12, a dielectric layer 116' and a conductive layer 114' are formed over the epitaxial layer 204, lining the gate opening 1102 (see, e.g., FIG. 11), and with the conductive layer 114' arranged over the dielectric layer 116'. The dielectric layer 116' and the conductive layer 114' may, for example, be formed conformally. Further, the dielectric layer 116' may, for example, be formed of silicon dioxide or some other dielectric, and/or the conductive layer 114' may, for example, be formed of a metal or doped polysilicon. In some embodiments, the process for forming the dielectric layer 116' and the conductive layer 114' comprises sequentially depositing or otherwise growing the dielectric layer 116' and the conductive layer 114' covering the epitaxial layer 204 and lining the gate opening 1102. The dielectric layer 116' and the conductive layer 114' may, for example, be deposited or otherwise growth by, for example, chemical vapor deposition (CVD), physical vapor deposition (PVD), atomic layer deposition (ALD), thermal oxidation, or a combination of the foregoing.

Figure 13:
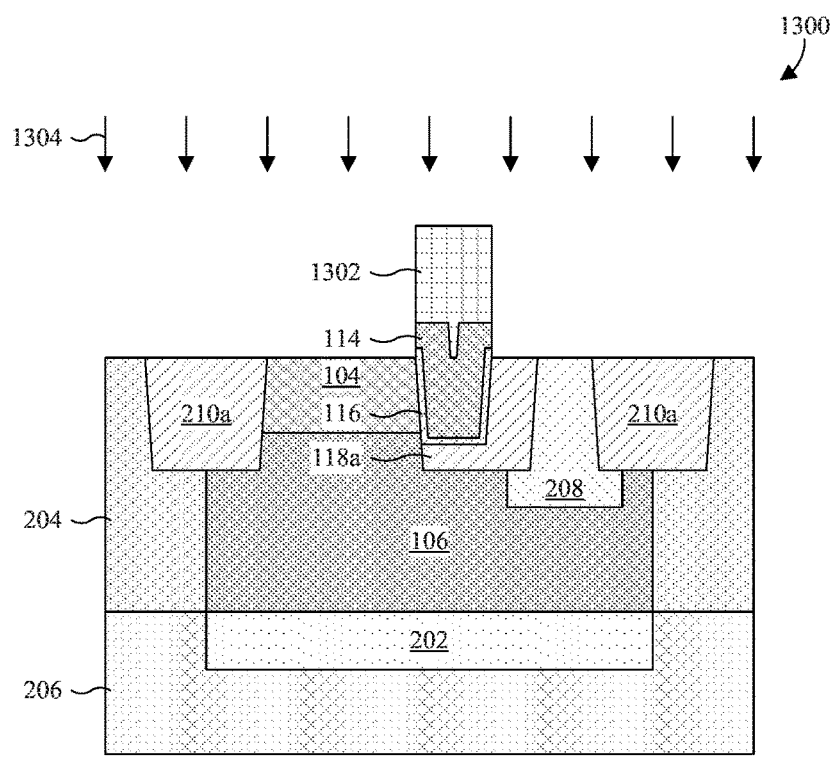

As illustrated by the cross-sectional view 1300 of FIG. 13, a second etch is performed into the conductive and dielectric layers 114', 116' (see, e.g., FIG. 12) to form a gate electrode 114 extending into the first STI region 118a and insulated from the first and second semiconductor regions 104, 106 by a gate dielectric layer 116. In some embodiments, the process for performing the second etch comprises forming a sixth photoresist layer 1302 over the conductive layer 114', covering a region of the conductive layer 114' corresponding to the gate electrode 114. Thereafter, in some embodiments, the process comprises applying etchants 1304 to the conductive and dielectric layers 114', 116' and subsequently removing the sixth photoresist layer 1302.

Figure 14:
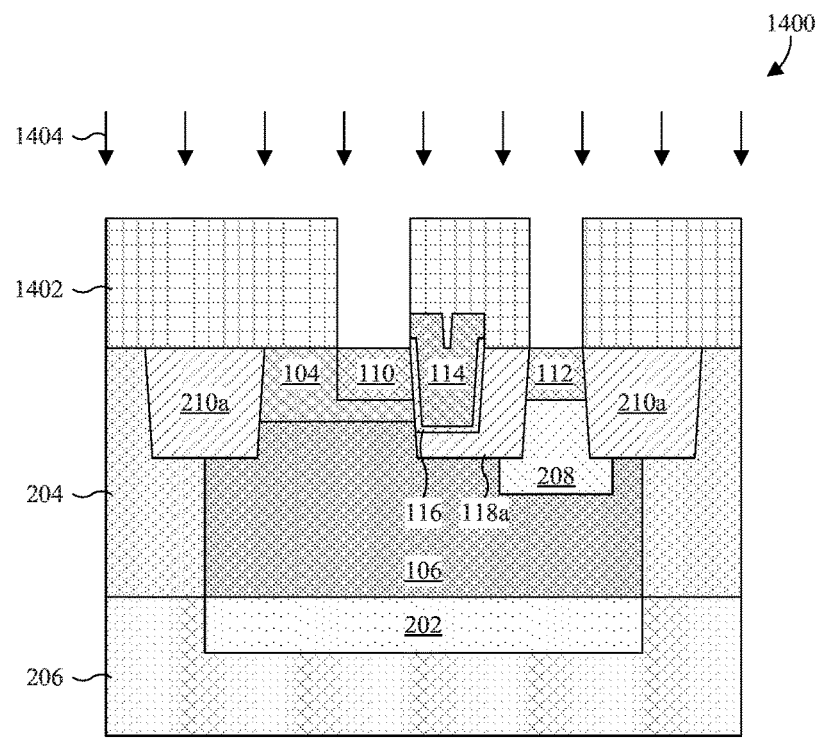

As illustrated by the cross-sectional view 1400 of FIG. 14, a first source/drain contact region 110 and a second source/drain contact region 112 are formed laterally spaced, on opposite sides of the gate electrode 114. Further, the first source/drain contact region 110 is formed over the first semiconductor region 104 and the second source/drain contact region 112 may, for example, be formed over the fourth semiconductor region 208. Even more, the first and second source/drain contact regions 110, 112 are formed with the second doping type and may, for example, be formed with a higher doping concentration than the first and/or fourth semiconductor regions 104, 208. In some embodiments, the process for forming the first and second source/drain contact regions 110, 112 comprises forming a seventh photoresist layer 1402 over the epitaxial layer 204, laterally surrounding regions of the epitaxial layer 204 to be the first and second source/drain contact regions 110, 112. Thereafter, in some embodiments, the process comprises performing ion implantation of dopants 1404 into the regions and subsequently removing the seventh photoresist layer 1402.

Figure 15:
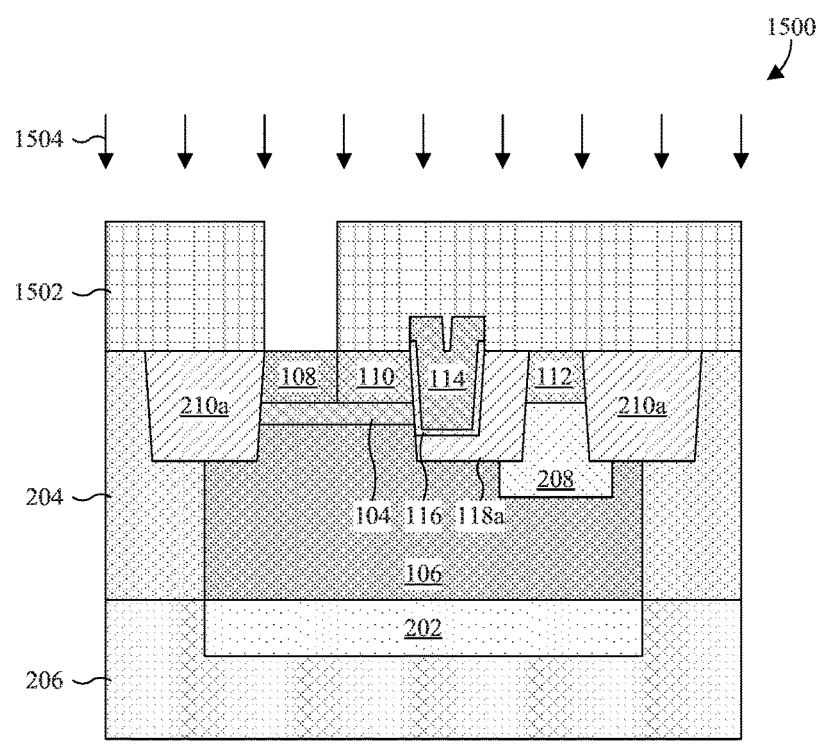

As illustrated by the cross-sectional view 1500 of FIG. 15, a body contact region 108 is formed over the first semiconductor region 104, laterally arranged on an opposite side of the first source/drain contact region 110 as the second source/drain contact region 112. Further, the body contact region 108 is formed with the first doping type and may, for example, be formed with a higher doping concentration than the first semiconductor region 104. In some embodiments, the process for forming the body contact region 108 comprises forming an eighth photoresist layer 1502 over the epitaxial layer 204, laterally surrounding a region of the epitaxial layer 204 to be the body contact region 108. Thereafter, in some embodiments, the process comprises performing ion implantation of dopants 1504 into the region and subsequently removing the eighth photoresist layer 1502.

Figure 16:
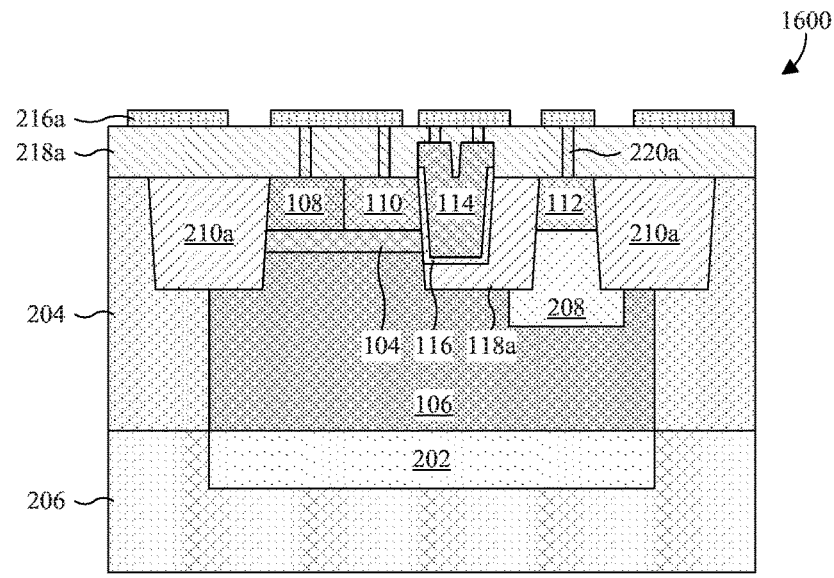

As illustrated by the cross-sectional view 1600 of FIG. 16, an ILD layer 218a is formed covering the gate electrode 114 and the epitaxial layer 204 with a planar upper or top surface. The ILD layer 218a may, for example, be formed of silicon dioxide, phosphosilicate glass (PSG), or a low κ dielectric. In some embodiments, the process for forming the ILD layer 218a comprises depositing or otherwise growing the ILD layer 218a and subsequently performing a planarization into the ILD layer 218a. The ILD layer 218a may, for example, be deposited or otherwise grown by thermal oxidation or CVD. The planarization may, for example, be performed by chemical mechanical polish (CMP).

Also illustrated by the cross-sectional view 1600 of FIG. 16, a layer of conductive features 216a and a layer of vias 220a are formed. The layer of conductive features 216a is formed over the ILD layer 218a. The layer of vias 220a is formed extending through the ILD layer 218a from the conductive features 216a and electrically coupling the layer of conductive features 216a to the gate electrode 114, the first and second source/drain contact regions 110, 112, and the body contact region 108. In some embodiments, the layer of conductive features 216a and the layer of vias 220a are formed according to a dual-damascene-like process. In other embodiments, the layer of conductive features 216a and the layer of vias 220a are formed according to a single-damascene-like process. A dual-damascene-like process and a single-damascene-like process may respectively be, for example, a dual-damascene process and a single-damascene that are not restricted to copper.

Figure 17:
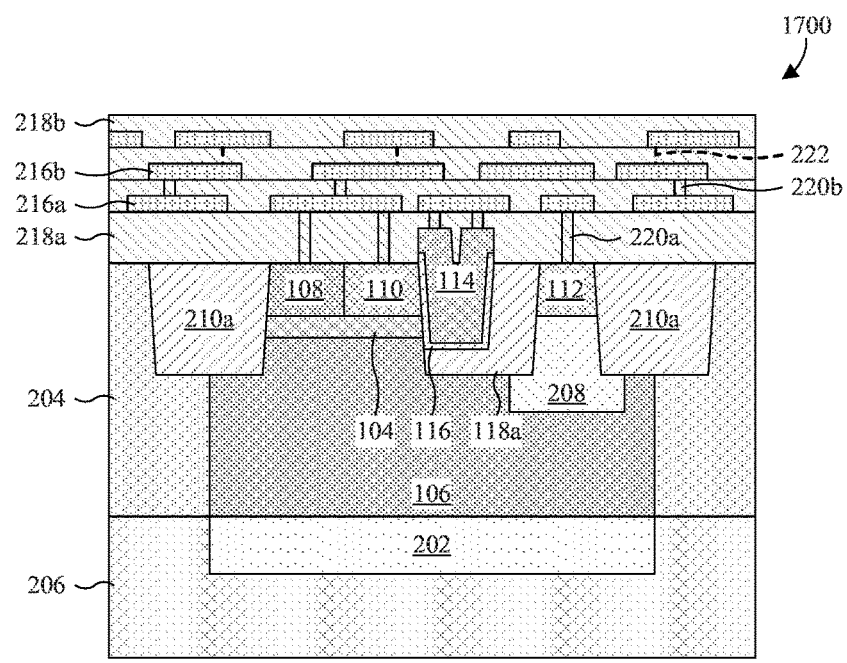

As illustrated by the cross-sectional view 1700 of FIG. 17, the acts of FIG. 16 are repeated multiple times to form additional ILD layers 218b and additional layers of conductive features 216b and vias 220b. For ease of illustration, dashed lines 222 are employed to represent one or more additional layers of vias and/or conductive features With reference to FIG. 18, a flowchart 1800 of some embodiments of the method of FIGS. 5-17 is provided.

At 1802, a first semiconductor region is formed over a second semiconductor region and with a different doping type than the second semiconductor region. See, for example, FIGS. 5-10.

At 1804, a gate electrode is formed laterally adjacent to the first semiconductor region and extending along a side boundary of the first semiconductor region from over the first semiconductor region. See, for example, FIGS. 11-13.

At 1806, a first source/drain contact region and a second source/drain contact region are respectively formed on opposite sides of the gate electrode, where the first source/drain contact region is formed over the first semiconductor region. See, for example, FIG. 14.

At 1808, a body contact region is formed over the first semiconductor region. See, for example, FIG. 15.

At 1810, an interconnect structure is formed over the gate electrode, the body contact region, and the first and second source/drain contact regions. See, for example, FIGS. 16 and 17.

While the method described by the flowchart 1800 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Figure 18:
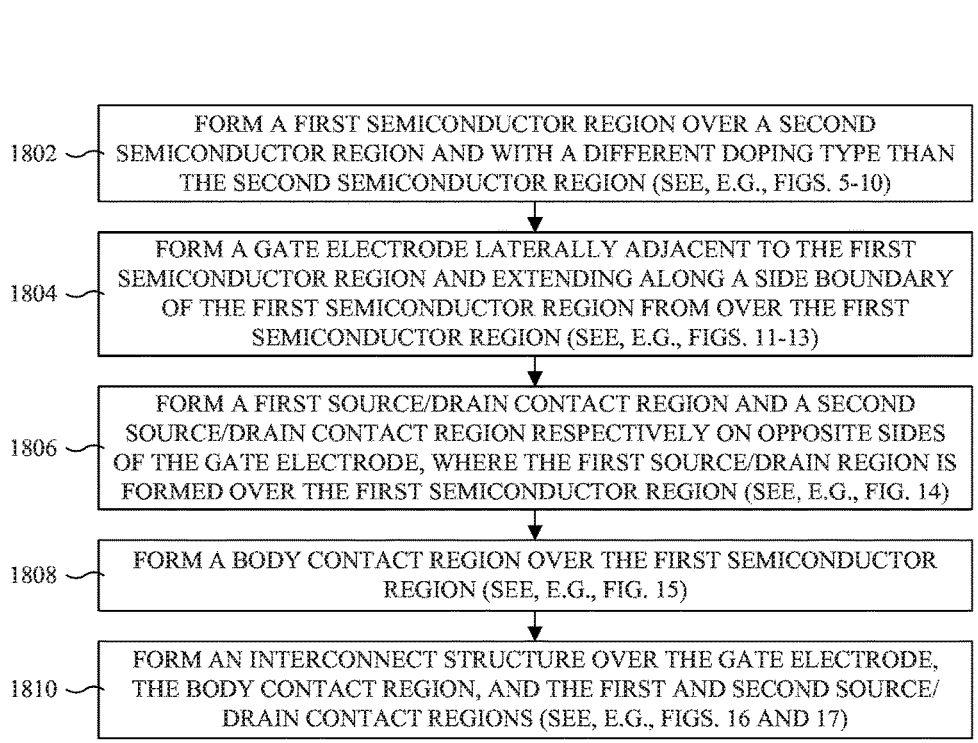
FIG. 18 illustrates a flowchart of some embodiments of the method of FIGS. 5-17.

With reference to FIGS. 19-27, a series of cross-sectional views 1900-2700 illustrate finFET embodiments of the method of FIG. 18. As will be seen, the cross-sectional views 1900-2700 are directed towards the LDMOS transistor of FIGS. 3A-3D. However, it is to be appreciated that the actions illustrated by the cross-sectional views 1900-2700 may be extended to cover other embodiments of the LDMOS transistor, such as the embodiments of FIGS. 4A-4D.

Figure 19:
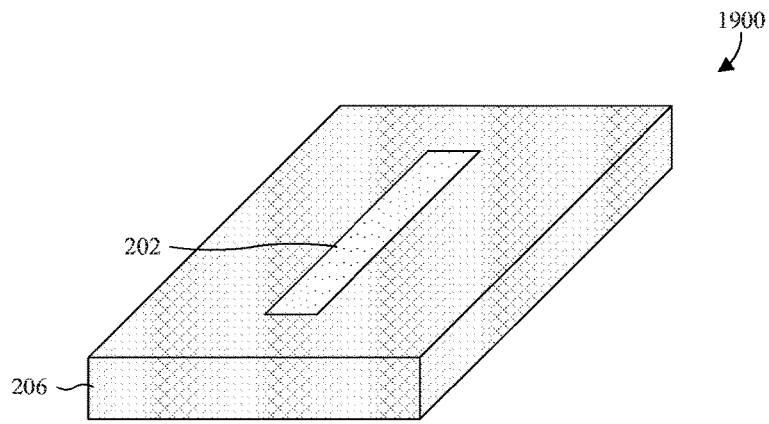
FIGS. 19-27 illustrate a series of cross-sectional views of some finFET embodiments of a method for manufacturing an LDMOS transistor with a vertical channel region.

As illustrated by the cross-sectional view 1900 of FIG. 19, a third semiconductor region 202 is formed in a semiconductor substrate 206, along an upper or top surface of the semiconductor substrate 206, and with a second doping type. In some embodiments, the process for forming the third semiconductor region 202 comprises ion implantation of dopants into a region of the semiconductor substrate 206 to be the third semiconductor region 202.

Figure 20:
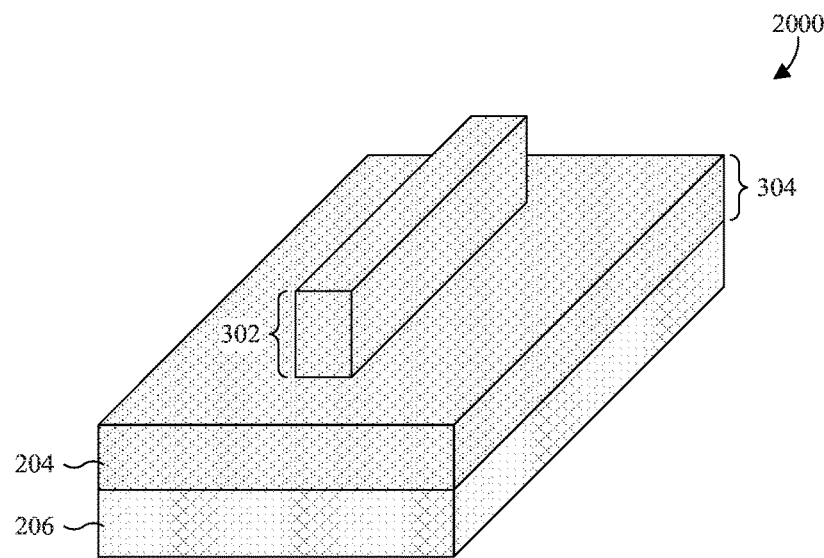

As illustrated by the cross-sectional view 2000 of FIG. 20, an epitaxial layer 204 is formed over the semiconductor substrate 206 and is selectively recessed to form a fin region 302 that protrudes vertically up form a base region 304 of the epitaxial layer 204. In some embodiments, the epitaxial layer 204 is selectively recessed by forming a photoresist layer (not shown) masking a region of the epitaxial layer 204 to be the fin region 302 and subsequently etching the epitaxial layer 204 with the photoresist layer in place. Further, in some embodiments, the epitaxial layer 204 is selectively recessed to form the fin region 302 with a pair of sections laterally spaced along a length of the fin region 302.

While not illustrated, in alternative embodiments of the method, the epitaxial layer 204 is omitted. In such embodiments, the third semiconductor region 202 is implanted deep within the semiconductor substrate 206 and the semiconductor substrate 206 is selectively recessed to form the fin region 302. The method may then proceed as described hereafter using the semiconductor substrate 206 in place of the epitaxial layer 204.

Figure 21:
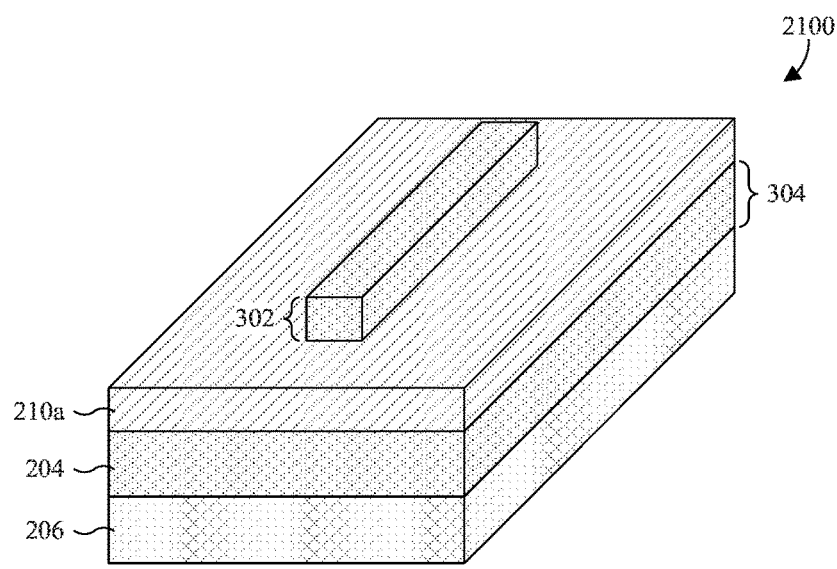

As illustrated by the cross-sectional view 2100 of FIG. 21, a second STI region 210a is formed covering the base region 304, laterally surrounding the fin region 302, and with an upper or top boundary recessed below an upper or top boundary of the fin region 302. In some embodiments, the second STI region 210a is formed by depositing or otherwise growing a dielectric layer over the epitaxial layer 204, planarizing a top surface of the dielectric layer, and performing an etch back into the dielectric layer to recess the dielectric layer to below the upper or top boundary of the fin region 302.

Figure 22:
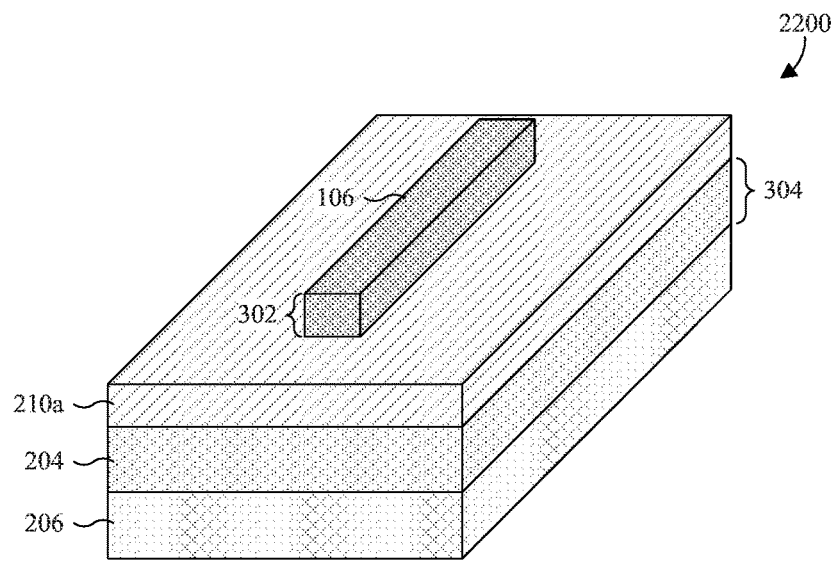

As illustrated by the cross-sectional view 2200 of FIG. 22, a second semiconductor region 106 is formed in the fin region 302 of the epitaxial layer 204 and with the second doping type. In some embodiments, the process for forming the second semiconductor region 106 comprises ion implantation of dopants into the fin region 302.

Figure 23:
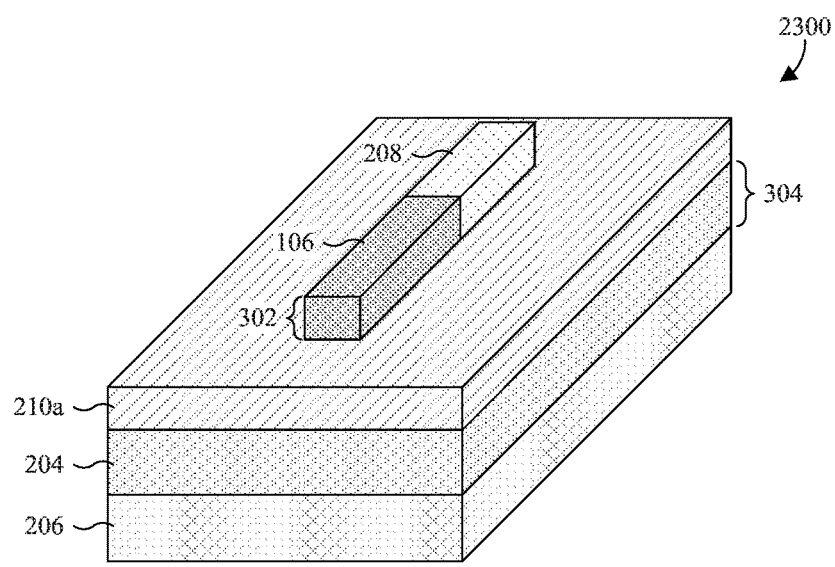

As illustrated by the cross-sectional view 2300 of FIG. 23, in some embodiments, a fourth semiconductor region 208 is formed in the fin region 302, over the second semiconductor region 106, and localized to a first end of the fin region 302. Further, the fourth semiconductor region 208 may be, for example, formed with the second doping type. In some embodiments, the process for forming the fourth semiconductor region 208 comprises ion implantation of dopants into the fin region 302.

Figure 24:
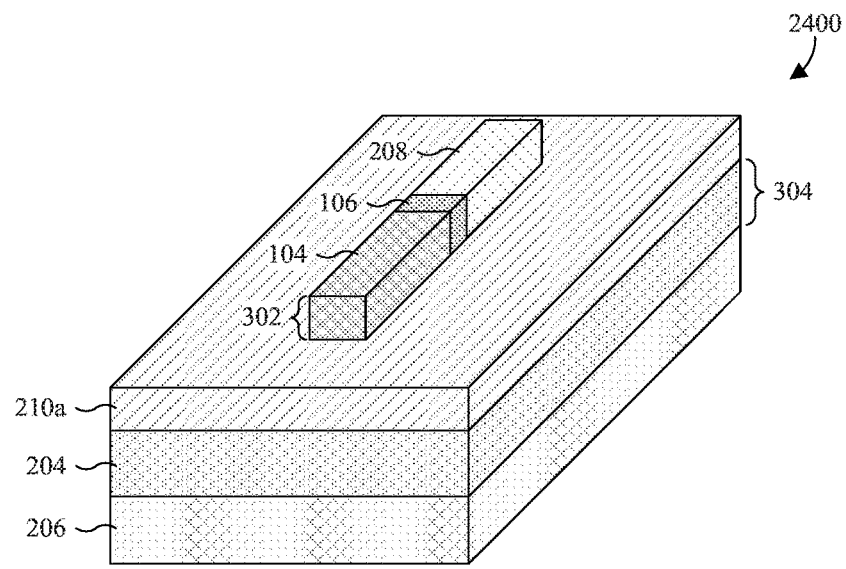

As illustrated by the cross-sectional view 2400 of FIG. 24, a first semiconductor region 104 is formed with a first doping type that is opposite the second doping type. Further, the first semiconductor region 104 is formed in the fin region 302, over the second semiconductor region 106, and localized to a second end of the fin region 302 that is opposite the first end. In some embodiments, the process for forming the first semiconductor region 104 comprises ion implantation of dopants into the fin region 302.

Figure 25:
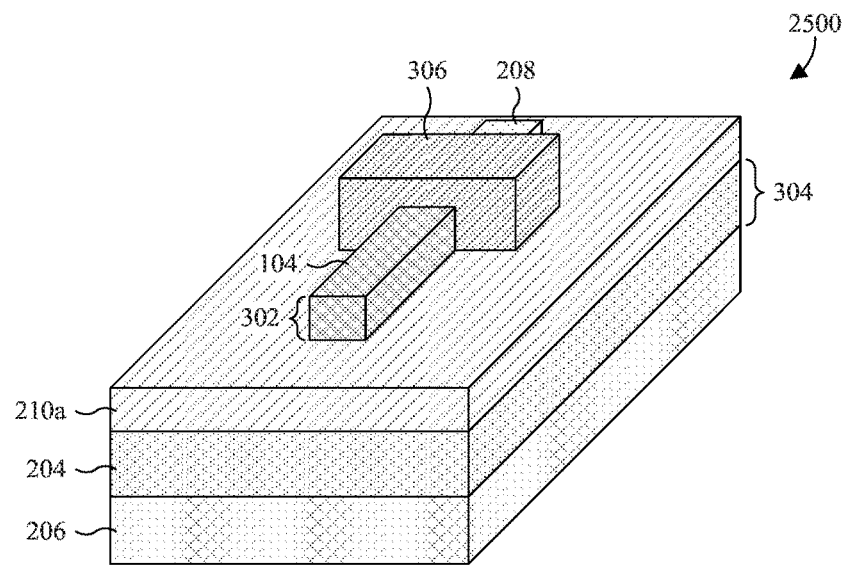

As illustrated by the cross-sectional view 2500 of FIG. 25, a recessed dielectric layer 306 is formed straddling the fin region 302 and laterally spaced from the first and second ends of the fin region 302. Further, the recessed dielectric layer 306 may be, for example, laterally spaced between the first and fourth semiconductor regions 104, 208. In some embodiments, the process for forming the recessed dielectric layer 306 comprises depositing a dielectric layer and selectively etching the dielectric layer using a photolithography.

Figure 26:
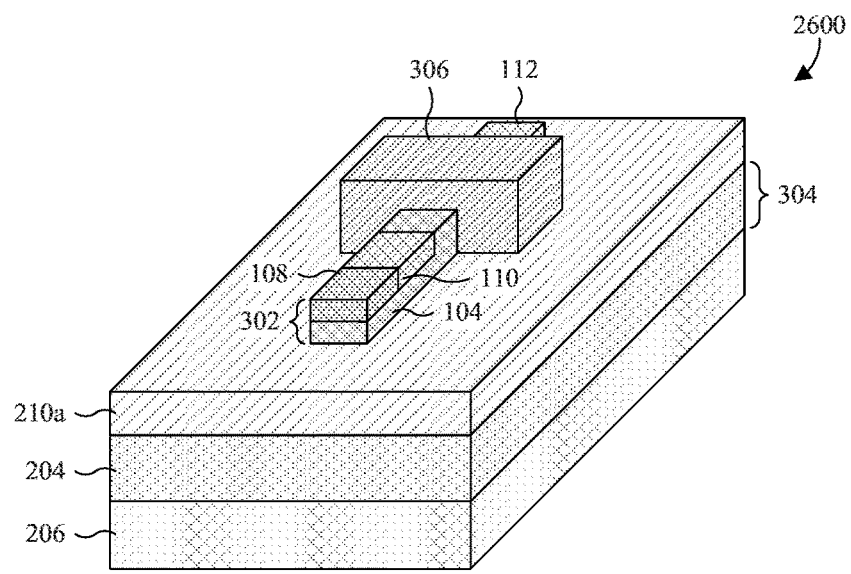

As illustrated by the cross-sectional view 2600 of FIG. 26, a first source/drain contact region 110 and a second source/drain contact region 112 are formed laterally spaced in the fin region 302, along the upper or top boundary of the fin region 302. Further, a body contact region 108 is formed in the fin region 302, laterally arranged on an opposite side of the first source/drain contact region 110 as the second source/drain contact region 112 and vertically arranged along the upper or top boundary of the fin region 302. In some embodiments, the process for forming the first and second source/drain contact regions 110, 112 and the body contact region 108 comprises ion implantation of dopants into the fin region 302.

Figure 27:
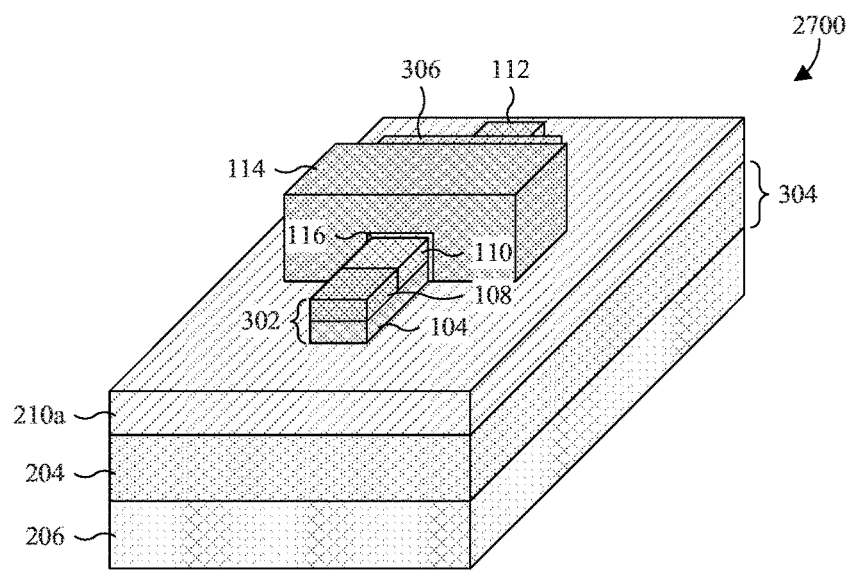

As illustrated by the cross-sectional view 2700 of FIG. 27, a gate dielectric layer 116 and a gate electrode 114 are formed straddling the fin region 302 and partially covering the recessed dielectric layer 306. Further, the gate dielectric layer 116 and the gate electrode 114 are formed laterally between the first and second source/drain contact regions 110, 112. In some embodiments, the process for forming the gate dielectric layer 116 and the gate electrode 114 comprises sequentially depositing a dielectric layer and a conductive layer, and selectively etching the dielectric and conductive layers layer using a photolithography.

While not illustrated, an interconnect structure may subsequently be formed covering the semiconductor structure of FIG. 27.

Thus, as can be appreciated from above, the present disclosure provides a first transistor. A first semiconductor region is arranged over a second semiconductor region. Further, the first and second semiconductor regions respectively have a first doping type and a second doping type different than the first doping type. A first source/drain contact region and a second source/drain contact region have the second doping type and are laterally spaced. Further, the first source/drain contact region is arranged over the first semiconductor region. A gate electrode is arranged laterally adjacent to the first semiconductor region and laterally between the first and second source/drain contact regions. Further, the gate electrode extends along a side boundary of the first semiconductor region.

In other embodiments, the present disclosure provides a method for manufacturing a transistor. A first semiconductor region is formed over a second semiconductor region and with a first doping type. The second semiconductor region has a second doping type different than the first doping type. A gate electrode is formed laterally adjacent to the first semiconductor region and extending along a side boundary of the first semiconductor region. A first source/drain contact region and a second source/drain contact region are respectively formed on opposite sides of the gate electrode and with the second doping type. The first source/drain contact region is further formed over the first semiconductor region.

In yet other embodiments, the present disclosure provides a second transistor. A first semiconductor region is arranged over a second semiconductor region. Further, the first and second semiconductor regions respectively have a first doping type and a second doping type different than the first doping type. A third semiconductor region is arranged under the second semiconductor region. Further, the third semiconductor region has the second doping type and a higher doping concentration than the second semiconductor region. A first source/drain contact region is arranged directly over the first semiconductor region and has the second doping type. A gate electrode is arranged laterally adjacent to the first semiconductor region and the first source/drain contact region. The gate electrode extends vertically along a side boundary of the first semiconductor region from over the first source/drain contact. A second source/drain contact region has the second doping type and is arranged on an opposite side of the gate electrode as the first source/drain contact.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A transistor comprising:
    a first semiconductor region arranged over a second semiconductor region, wherein the first and second semiconductor regions respectively have a first doping type and a second doping type different than the first doping type;
    a first source/drain contact region and a second source/drain contact region having the second doping type and laterally spaced, wherein the first source/drain contact region is arranged over the first semiconductor region;
    a gate electrode arranged laterally adjacent to the first semiconductor region and laterally between the first and second source/drain contact regions, wherein the gate electrode extends along a side boundary of the first semiconductor region; and
    a drift region arranged in the second semiconductor region, wherein the drift region extends continuously with a single doping type from contact with the first semiconductor region to contact with the second source/drain contact region, and wherein the single doping type is the second doping type.

2. The transistor according to claim 1, further comprising:
a channel region arranged in the first semiconductor region and extending vertically to a lower boundary of the first semiconductor region from the first source/drain contact region, wherein the drift region contacts the first semiconductor region at the channel region.

3. The transistor according to claim 1, further comprising:
an isolation region arranged laterally adjacent to the first semiconductor region and arranged laterally between the first and second source/drain contact regions, wherein the gate electrode protrudes into the isolation region.

4. The transistor according to claim 3, wherein the second source/drain contact region extends vertically to about even with a bottom boundary of the isolation region, and wherein the transistor further comprises:
an additional semiconductor region arranged over the second semiconductor region, and further arranged under the isolation region and the second source/drain contact region, wherein the additional semiconductor region has the second doping type and a different doping concentration than the second semiconductor region and the second source/drain contact region.

5. The transistor according to claim 3, wherein the second source/drain contact region is arranged under the isolation region, and wherein the transistor further comprises an interlayer dielectric region extending through the isolation region to the second source/drain contact region.

6. The transistor according to claim 3, further comprising:
an additional isolation region arranged on an opposite side of the first or second source/drain contact region as the gate electrode, wherein the isolation region is one of a shallow trench isolation (STI) region and a deep trench isolation (DTI) region, and wherein the additional isolation region is another one of the STI region and the DTI region.

7. The transistor according to claim 1, further comprising:
an epitaxial layer arranged over a semiconductor substrate and accommodating the first and second semiconductor regions and the first and second source/drain contact regions.

8. The transistor according to claim 1, wherein the first and second source/drain contact regions are arranged in, and laterally spaced along a length of, a fin region.

9. The transistor according to claim 8, further comprising:
a dielectric layer and a gate electrode straddling the fin region, wherein the gate electrode partially covers the dielectric layer.

10. The transistor according to claim 8, wherein the fin region comprises a pair of sections laterally spaced along the length of the fin region, and wherein the gate electrode is laterally arranged between the sections.

11. A method for manufacturing a transistor, the method comprising:
forming a first semiconductor region over a second semiconductor region and with a first doping type, wherein the second semiconductor region has a second doping type different than the first doping type, and further has a first side and a second side opposite the first side, and wherein the first semiconductor region is formed on the first side, but not the second side, by selective ion implantation;

forming a gate electrode laterally adjacent to the first semiconductor region, between the first and second sides of the second semiconductor region, and extending along a side boundary of the first semiconductor region; and forming a first source/drain contact region and a second source/drain contact region respectively on opposite sides of the gate electrode and with the second doping type, wherein the first source/drain contact region is further formed over the first semiconductor region.

12. The method according to claim 11, further comprising:
performing a first ion implantation into a semiconductor substrate to form a third semiconductor region in the semiconductor substrate;
forming an epitaxial layer covering the semiconductor substrate and the third semiconductor region; and
forming the first and second semiconductor regions in the epitaxial layer, over the third semiconductor region.

13. The method according to claim 12, further comprising:
forming a first isolation region and a second isolation region extending into the epitaxial layer with the second isolation region laterally spaced on opposite sides of the first isolation region;
performing a second ion implantation into the epitaxial layer to form the second semiconductor region in the epitaxial layer and laterally between the second isolation region; and
performing a third ion implantation into the epitaxial layer to form the first semiconductor region in the epitaxial layer, over the second semiconductor region, and localized to one of the opposite sides of the first isolation region.

14. The method according to claim 11, further comprising:
performing a first ion implantation into a semiconductor substrate to form a third semiconductor region buried in a semiconductor substrate;
forming a first isolation region and a second isolation region extending into the semiconductor substrate with the second isolation region laterally spaced on opposite sides of the first isolation region;
performing a second ion implantation into the semiconductor substrate to form the second semiconductor region in the semiconductor substrate, over the third semiconductor region, and laterally between the second isolation region; and
performing a third ion implantation into the semiconductor substrate to form the first semiconductor region in the semiconductor substrate, over the second semiconductor region, and localized to one of the opposite sides of the first isolation region.

15. The method according to claim 11, further comprising:
forming an isolation region extending into the second semiconductor region;
performing an etch into the isolation region to form a gate opening; and
forming the gate electrode in the gate opening.

16. The method according to claim 11, further comprising:
performing an etch into a semiconductor substrate or an epitaxial layer to form a fin region protruding upward;
forming an isolation region laterally surrounding the fin region with an upper boundary recessed below an upper boundary of the fin region;

performing a first ion implantation into the fin region to form the second semiconductor region in the fin region; and performing a second ion implantation into the fin region to form the first semiconductor region in the fin region, over the second semiconductor region, and localized to an end of the fin region.

17. The method according to claim 11, further comprising:

performing an etch into a semiconductor substrate or an epitaxial layer to form a fin region protruding upward and with a pair of laterally spaced sections;

forming an isolation region laterally between the sections of the fin region and laterally surrounding the fin region, wherein the isolation region is further formed with an upper boundary recessed below an upper boundary of the fin region;

performing a first ion implantation into the fin region to form the second semiconductor region in the fin region; and performing a second ion implantation into the fin region to form the first semiconductor region in the fin region, over the second semiconductor region, and localized to an end of the fin region.

18. The method according to claim 17, further comprising:

forming the gate electrode straddling a first section of the fin region, laterally between the sections of the fin region.

19. A transistor comprising:

a first semiconductor region arranged over a second semiconductor region, wherein the first and second semiconductor regions respectively have a first doping type and a second doping type different than the first doping type;

a third semiconductor region arranged under the second semiconductor region, wherein the third semiconductor region has the second doping type and a higher doping concentration than the second semiconductor region;

a first source/drain contact region arranged directly over the first semiconductor region and having the second doping type;

a gate electrode arranged laterally adjacent to the first semiconductor region and the first source/drain contact region, wherein the gate electrode extends vertically along a side boundary of the first semiconductor region from over the first source/drain contact region;

a second source/drain contact region having the second doping type and arranged on an opposite side of the gate electrode as the first source/drain contact region; and a fourth semiconductor region extending continuously from contact with the second semiconductor region to contact with the second source/drain contact region, wherein the fourth semiconductor region has the second doping type and a doping concentration different than doping concentrations respectively of the second source/drain contact region and the second semiconductor region.

20. The transistor according to claim 1, further comprising:

an interconnect structure covering the first and second semiconductor regions and the first and second source/drain contact regions, wherein the interconnect structure comprises a stack of conductive layers and a via layer, and wherein the via layer comprises a pair of vias extending from contact with one of the conductive layers respectively to contact with the first and second source/drain contact regions.

* * * * *